US012156403B2

(12) United States Patent
Lo et al.

(10) Patent No.: US 12,156,403 B2
(45) Date of Patent: Nov. 26, 2024

(54) METHOD TO IMPROVE DATA RETENTION OF NON-VOLATILE MEMORY IN LOGIC PROCESSES

(71) Applicant: Taiwan Semiconductor Manufacturing Company, Ltd., Hsinchu (TW)

(72) Inventors: Wen-Shun Lo, Zhudong Township (TW); Tai-Yi Wu, Hsinchu County (TW); Shih-Hsien Chen, Zhubei (TW); Yingkit Felix Tsui, Cupertino, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 485 days.

(21) Appl. No.: 17/408,621

(22) Filed: Aug. 23, 2021

(65) Prior Publication Data

US 2022/0415914 A1 Dec. 29, 2022

Related U.S. Application Data

(60) Provisional application No. 63/215,056, filed on Jun. 25, 2021.

(51) Int. Cl.
*H10B 41/35* (2023.01)
*H10B 41/10* (2023.01)

(52) U.S. Cl.
CPC .............. *H10B 41/35* (2023.02); *H10B 41/10* (2023.02)

(58) Field of Classification Search
CPC ........ H10B 41/35; H10B 41/10; H10B 41/00; H10B 41/30
See application file for complete search history.

(56) References Cited

U.S. PATENT DOCUMENTS

| 4,871,689 | A | * | 10/1989 | Bergami | ........... H01L 21/76229 |
| | | | | | 257/E21.548 |
| 6,689,653 | B1 | * | 2/2004 | Seah | ..................... H01L 27/105 |
| | | | | | 438/258 |
| 10,083,757 | B2 | * | 9/2018 | Chen | ................... H01L 29/7881 |
| 2007/0023822 | A1 | | 2/2007 | Sung et al. | |
| 2015/0091073 | A1 | | 4/2015 | Li et al. | |
| 2017/0084620 | A1 | * | 3/2017 | Wu | ........................ H10B 20/20 |
| 2019/0325923 | A1 | | 10/2019 | Hoang et al. | |

OTHER PUBLICATIONS

Wu et al. "Modelling of initial fast charge loss mechanism for logic embedded non-volatile memories" Microelectronics Reliability 76-77 (2017) 174-177, published on Jul. 14, 2017.

* cited by examiner

*Primary Examiner* — Kimberly N Rizkallah
*Assistant Examiner* — Nicholas B Michaud
(74) *Attorney, Agent, or Firm* — Eschweiler & Potashnik, LLC

(57) ABSTRACT

In some embodiments, the present disclosure relates to an integrated chip (IC), including a substrate, a floating gate electrode disposed over the substrate, a contact etch stop layer (CESL) structure disposed over the floating gate electrode, an insulating stack separating the floating gate electrode from the CESL structure, the insulating stack including a first resist protective layer disposed over the floating gate electrode, a second resist protective layer disposed over the first resist protective layer, and an insulating layer separating the first resist protective layer from the second resist protective layer.

20 Claims, 14 Drawing Sheets

2200

METHOD TO IMPROVE DATA RETENTION OF NON-VOLATILE MEMORY IN LOGIC PROCESSES

REFERENCE TO RELATED APPLICATION

This Application claims the benefit of U.S. Provisional Application No. 63/215,056, filed on Jun. 25, 2021, the contents of which are hereby incorporated by reference in their entirety.

BACKGROUND

Many modern day electronic devices include non-volatile memory. Non-volatile memory is electronic memory that is able to store data in the absence of power. Various types of non-volatile memory can have a relatively simple structure and may be compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
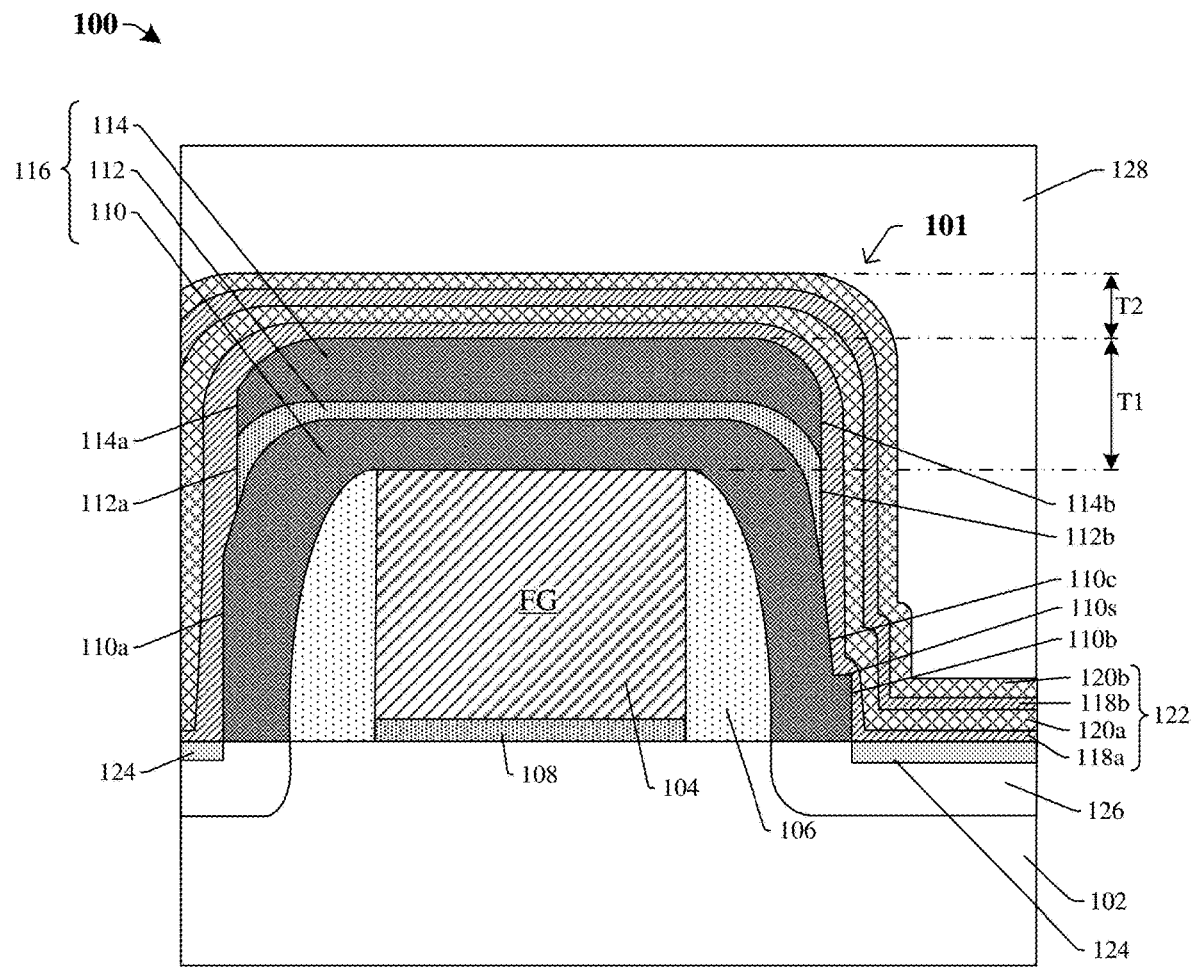
FIG. 1 illustrates a cross-sectional view of some embodiments of an integrated chip (IC) comprising a floating gate transistor having an insulating stack separating a floating gate electrode from a contact etch stop layer (CESL) structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Contact etch stop layer (CESL) structures are commonly used in non-volatile memory devices to generate a tensile strain in a channel region of the memory device. In doing so, CESL structures enhance electron carrier mobility in non-volatile memory, and greatly help to improve performance of these memory devices.

Some non-volatile memory devices may comprise a floating gate electrode disposed over a substrate, a resist protective layer disposed over the floating gate electrode, and a CESL structure disposed over the resist protective layer. However, depending on the growth conditions of the CESL structure, the CESL structure may have both positive and negative defect charges. At high temperatures, with an electric field coming from the floating gate electrode, the defect charges within the CESL structure can diffuse according to the electric field. This can lead to the formation of a dipole between the defect charges within the CESL structure and the charges stored in the floating gate electrode. Thus, some non-volatile memory devices can have an unintended capacitive effect across the resist protective layer. This unintended capacitive effect can lead to degradation of the data retention capabilities of the non-volatile memory devices.

To avoid the unintended capacitive effect and thus the data retention degradation, some non-volatile memory devices comprise a CESL structure with nitrogen-rich silicon nitride, which has fewer defect charges, leading to less of an impact on data retention. However, this approach can negatively impact parameters of logic devices, leading to other problems with device performance. Alternatively, a portion of the CESL structure overlying the floating gate electrode may be removed to avoid the unintended capacitive effect and thus data retention degradation. However, this approach has a very small process window, such that too large of an etch and too small of an etch both have a high risk of metal contamination in processing tools.

In view of the above, the present disclosure relates to a non-volatile memory device comprising an insulating stack separating a floating gate electrode from a CESL structure. The insulating stack comprises a first resist protective layer disposed over the floating gate electrode, a second resist protective layer disposed over the first resist protective layer, and an insulating layer separating the first resist protective layer from the second resist protective layer. By separating the floating gate electrode from the CESL structure with a multi-layered insulating stack, a distance between the CESL structure and the floating gate electrode is increased. Thus, the unintended capacitive effect, and therefore the data retention degradation, of the non-volatile memory device is lessened. This is accomplished without risk of metal contamination and is a production-friendly approach.

FIG. 1 illustrates a cross-sectional view 100 of some embodiments of an IC including a floating gate transistor 101 comprising an insulating stack 116 separating a floating gate electrode (FG) 104 from a CESL structure 122. The floating gate electrode 104 is disposed over a substrate 102. Sidewall spacers 106 are disposed on opposing sidewalls of the floating gate electrode 104, and a floating gate dielectric layer 108 separates the floating gate electrode 104 from the substrate 102. Doped regions 126 of the substrate 102 are disposed respectively on opposing sides of the floating gate electrode 104, and correspond to source/drain regions of the floating gate transistor 101. In some embodiments, the doped regions 126 have a first doping type (e.g., n-type). One or more silicide layers 124 is disposed along a top surface of the doped regions 126, and allow for ohmic connection to the source/drain regions. A dielectric structure 128 is disposed over the CESL structure 122.

The CESL structure 122 comprises a plurality of oxide layers and a plurality of nitride layers alternatingly stacked over the floating gate electrode 104 and the substrate 102. In some embodiments, the plurality of oxide layers comprises no more than two layers. In some embodiments, the plurality of nitride layers comprises no more than two layers. For example, in the illustrated embodiment, the CESL structure 122 comprises a lower oxide layer 118a, a lower nitride layer 120a over the lower oxide layer 118a, an upper oxide layer 118b over the lower nitride layer 120a, and an upper nitride layer 120b over the upper oxide layer 118b. In some embodiments, the CESL structure 122 is conformally disposed over the insulating stack 116. In some embodiments, the CESL structure 122 is highly stressed, and provides a tensile stress on a channel region of the substrate 102 to improve saturated drive current.

The insulating stack 116 separates the CESL structure 122 from the floating gate electrode 104. The insulating stack 116 comprises a first resist protective layer 110 disposed over the floating gate electrode 104, a second resist protective layer 114 disposed over the first resist protective layer 110, and an insulating layer 112 separating the first resist protective layer 110 from the second resist protective layer 114. The first resist protective layer 110 extends along a curved surface of the sidewall spacers 106 from above the floating gate electrode 104 to the substrate 102. In some embodiments, the first resist protective layer 110 directly overlies the doped regions 126 of the substrate 102.

The first resist protective layer 110 comprises a first outer sidewall 110a and a second outer sidewall 110b, the insulating layer 112 comprises a first outer sidewall 112a and a second outer sidewall 112b, and the second resist protective layer 114 comprises a first outer sidewall 114a and a second outer sidewall 114b. In some embodiments, the first outer sidewall 114a or the second outer sidewall 114b of the second resist protective layer 114 extends below an upper surface of the insulating layer 112. In some embodiments, the first outer sidewall 112a and the second outer sidewall 112b of the insulating layer 112 are respectively aligned with the first outer sidewall 114a and the second outer sidewall 114b of the second resist protective layer 114 along a substantially vertical axis. In some embodiments, the first resist protective layer 110 further comprises a third outer sidewall 110c that generally faces a same direction as the second outer sidewall 110b. In further embodiments, the second outer sidewall 110b and the third outer sidewall 110c are connected by a laterally extending surface 110s of the first resist protective layer 110.

The insulating stack 116 has a first thickness T1 as measured over the floating gate electrode 104. The CESL structure 122 has a second thickness T2 as measured over the floating gate electrode 104. In some embodiments, the first thickness T1 is greater than the second thickness T2. In some embodiments, the first thickness T1 may range from approximately two times greater to approximately four times greater than the second thickness T2, from approximately three times greater to approximately four times greater than the second thickness T2, or some other suitable value.

Since the floating gate electrode 104 is separated from the CESL structure 122 by an insulating stack 116 comprising multiple layers, there is a sufficient distance (e.g., the first thickness T1) between the CESL structure 122 and the floating gate electrode 104 to ensure that an unintended capacitive effect between the CESL structure 122 and the floating gate electrode 104 is lessened in comparison to an IC that does not comprise an insulating stack. Therefore, the data retention degradation of the device is lessened.

In some embodiments, the first thickness T1 may range from approximately 1100 Angstroms to approximately 3200 Angstroms, from approximately 1875 Angstroms to approximately 3200 Angstroms, from approximately 1100 Angstroms to approximately 1875 Angstroms, or some other suitable value. In some embodiments, if the first thickness T1 is too large (e.g., greater than approximately 3200 Angstroms), portions of the insulating stack 116 may be too difficult to remove. In some embodiments, if the first thickness T1 is too small (e.g., less than approximately 1100 Angstroms), the unintended capacitive effect between the CESL structure 122 and the floating gate electrode 104 may not be sufficiently lessened in comparison to an IC that does not comprise an insulating stack. In some embodiments, the second thickness T2 may range from approximately 500 Angstroms to approximately 900 Angstroms, from approximately 500 Angstroms to approximately 750 Angstroms, from approximately 750 Angstroms to approximately 900 Angstroms, or some other suitable value.

In some embodiments, the substrate 102 may have a second doping type (e.g., p-type) opposite the first doping type. In some embodiments, the substrate 102 may be or comprise, for example, a monocrystalline silicon substrate, a silicon-on-insulator (SOI) substrate, a polymer substrate, silicon germanium, a group III-V material, a group II-VI material, some other suitable semiconductor material, or any combination of the foregoing. The group III-V material may, for example, be or comprise gallium arsenide (e.g., GaAs), gallium arsenide indium (e.g., GaAsIn), some other suitable group III-V material, or any combination of the foregoing. The group II-VI material may, for example, be or comprise zinc oxide (e.g., ZnO), magnesium oxide (e.g., MgO), gadolinium oxide (e.g., GdO), some other suitable II-VI material, or any combination of the foregoing. In some embodiments, the floating gate electrode 104 may be or comprise, for example, doped polysilicon or some other suitable material(s). In some embodiments, the sidewall spacers 106 may be or comprise, for example, silicon nitride, silicon dioxide, some other suitable dielectric material(s), or a combination of the foregoing.

In some embodiments, the floating gate dielectric layer 108 may be or comprise, for example, a high-k dielectric material, such as hafnium oxide (HfO), tantalum oxide (TaxOy), hafnium silicon oxide (HfSiO), hafnium tantalum oxide (HfTaO), aluminum oxide (AlxOy), zirconium oxide (ZrO), or the like. In some embodiments, the first resist protective layer 110, the second resist protective layer 114, the lower oxide layer 118a, and the upper oxide layer 118b may be or comprise, for example, silicon dioxide, silicon oxynitride, some other suitable oxide(s), or the like. In some embodiments, the insulating layer 112, the lower nitride layer 120a, and the upper nitride layer 120b may be or comprise, for example, silicon nitride, some other suitable nitride(s), or the like.

In some embodiments, the insulating layer 112 may have a refractive index that is less than that of the lower nitride layer 120a or the upper nitride layer 120b. In some embodiments, the insulating layer 112 may comprise a material that is more nitrogen-rich than that of the lower nitride layer 120a or the upper nitride layer 120b. In some embodiments, the insulating layer 112 may have a refractive index ranging from approximately 1.6 to approximately 1.9, from approximately 1.6 to approximately 1.75, from approximately 1.75 to approximately 1.9, or some other suitable value. In some embodiments, if the refractive index of the insulating layer 112 is too large (e.g., greater than 1.9), the insulating layer 112 may comprise charged defects, which can lead to the formation of a dipole between the defect charges and the charges stored in the floating gate electrode 104, hence leading to an unintended capacitive effect across the first resist protective layer 110. In some embodiments, if the refractive index of the insulating layer 112 is too small (e.g., less than 1.6), electrical parameters of the device may shift in an undesirable manner.

In some embodiments, the plurality of silicide layers 124 may be or comprise, for example, a metal silicide (e.g., cobalt silicide, titanium silicide, nickel silicide, or the like) or some other suitable material(s). In some embodiments, the dielectric structure 128 may be or comprise, for example, nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

Figure 2A:
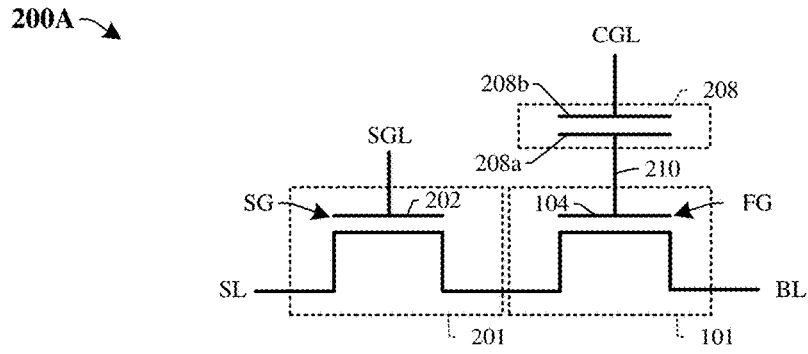
FIGS. 2A-2B illustrate a schematic view and a top view of some embodiments of an memory cell comprising a floating gate electrode and an insulating stack overlying the floating gate electrode and a capacitor.
Figure 2B:
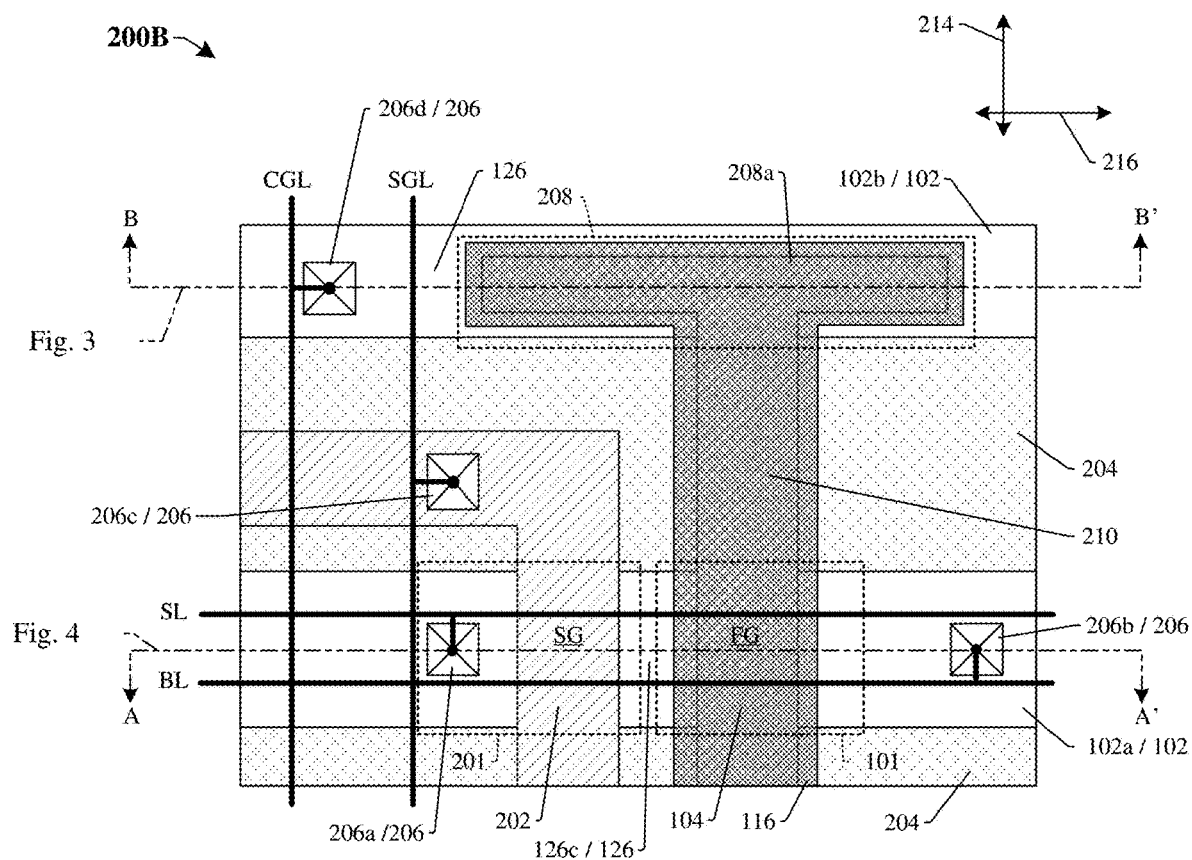
Figures 3, 4:
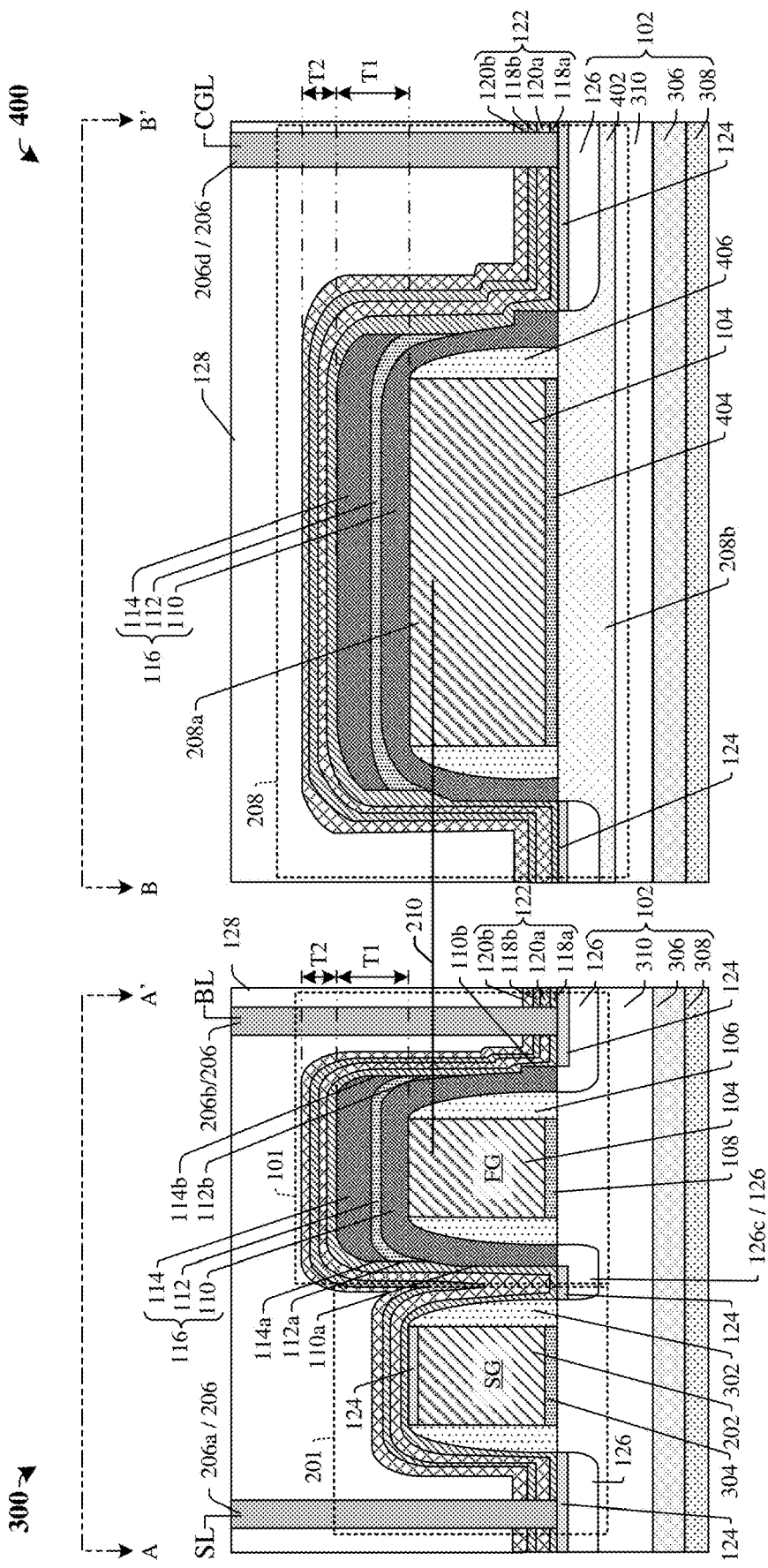
FIG. 3 illustrates a cross-sectional view of some embodiments of FIG. 2B's memory cell taken along line A-A'.
FIG. 4 illustrates a cross-sectional view of FIG. 2B's memory cell taken along line B-B'.

FIG. 2A-2B illustrates a schematic view 200A and a top view 200B, respectively of some embodiments of a memory cell comprising a floating gate transistor 101, a select gate transistor 201, and a capacitor 208, which are operably coupled to store one or more bits of data. As can be seen in FIGS. 3-4, which show some embodiments of cross-sectional views of the memory cell of FIG. 2B, an insulating stack 116 overlies a floating gate electrode 104 of the floating gate transistor 101 and overlies a top capacitor plate 208a of the capacitor 208 to limit capacitive effect and improve data retention for the memory cell.

With respect to the schematic view 200A of FIG. 2A, a first terminal of the select gate transistor 201 is coupled to a source line SL. A first terminal of a floating gate transistor 101 is coupled to a bit line BL. A second terminal of the select gate transistor 201 is shared with a second terminal of the floating gate transistor 101. A select gate electrode (SG) 202 of the select gate transistor 201 is coupled to a select gate line SGL. A floating gate electrode (FG) 104 of the floating gate transistor 101 is coupled to the capacitor 208 by a coupling segment 210. In some embodiments, the coupling segment 210 couples the floating gate electrode 104 to a top capacitor plate 208a of the capacitor 208, and a bottom capacitor plate 208b of the capacitor is coupled to a control gate line CGL.

In some embodiments, the schematic view 200A represents a single multi-time programmable (MTP) memory cell. In further embodiments, an IC may comprise a plurality of similar memory cells arranged into a plurality of rows and a plurality of columns. In some embodiments, the memory cell may be in a two-transistor-one-capacitor (2T1C) configuration. During operation of the memory cell, electrons stored in capacitor 208 (and/or the floating gate electrode 104) are employed to represent a bit of data. For example, a charged floating gate electrode 104 may represent a binary 0, whereas an uncharged floating gate electrode 104 may represent a binary 1. In alternative embodiments, a charged floating gate electrode 104 may represent a binary 1, whereas an uncharged floating gate electrode 104 may represent a binary 0. In some embodiments, a charged floating gate electrode 104 results in the floating gate transistor 101 having a higher threshold voltage compared to an uncharged floating gate electrode 104.

In some embodiments, to program a bit of data to the memory cell, a positive electrical bias is applied to the control gate line CGL and a positive electrical bias is applied to the bit line BL. In doing so, and electrons are injected (e.g., by hot electron injection) into the floating gate electrode 104. In some embodiments, the electrical bias applied to the control gate line CGL is greater than the electrical bias applied to the bit line BL. In some embodiments, in programming a bit of data, the capacitor 208 operates in accumulation.

In some embodiments, to erase a bit of data from the memory cell, a negative electrical bias is applied to the control gate line CGL and a positive electrical bias is applied to the bit line BL, and allowing the source line SL to electrically float. In doing so, holes are injected (e.g., by hot hole injection) into the floating gate electrode 104. Hence, holes are trapped locally, some of which recombine with electrons in the floating gate electrode 104 to remove the charge. In some embodiments, in erasing a bit of data, the capacitor 208 operates in inversion.

In some embodiments, to read a bit of data from the memory cell, proper bias conditions are applied such that a data state (e.g., threshold voltage) of the memory cell may be accessed by measuring a current across the bit line BL. In some embodiments, the select gate electrode 202 and the select gate line SGL allow for additional control on memory cell operations and help to avoid eventual over-erase failures in memory arrays.

With respect to the top view 200B of FIG. 2B, the capacitor 208, the select gate electrode 202, and the floating gate electrode 104 corresponding to the schematic view 200A overlie a substrate 102. Individual portions 102a, 102b of the substrate 102 are separated in a first direction 214 by an isolation structure 204. The floating gate electrode 104 overlies a first portion 102a of the substrate 102, and the capacitor 208 overlies the second portion 102b of the substrate 102. In some embodiments, the isolation structure 204 may be a shallow trench isolation (STI) structure. The floating gate electrode 104 is connected to a top capacitor plate 208a of the capacitor 208 by a coupling segment 210. The coupling segment 210 extends in the first direction 214 from the first portion 102a of the substrate 102, over the isolation structure 204, to the second portion 102b of the substrate 102. In some embodiments, the top capacitor plate 208a of the capacitor 208 is elongated in a second direction 216 orthogonal to the first direction 214.

In some embodiments, the first portion 102a of the substrate 102 comprises doped regions 126 having a first doping type (e.g., n-type) on opposing sides of the select gate electrode 202 and the floating gate electrode 104. In some embodiments, a common doped region 126c (e.g., a common source/drain region) is disposed between and shared by the select gate transistor 201 and the floating gate transistor 101. The select gate transistor 201 comprises the select gate electrode 202 and the doped regions 126. The floating gate transistor 101 comprises the floating gate electrode 104 and the doped regions 126.

In some embodiments, the second portion 102b of the substrate 102 comprises doped regions (not shown) having the first doping type on opposing sides of the capacitor 208. In some embodiments, the second portion 102b of the substrate 102 comprises a doped capacitor region (not shown) disposed beneath the top capacitor plate 208a of the capacitor 208 having the first doping type that is more lightly doped than the doped regions. In some embodiments, the doped capacitor region serves as a bottom capacitor plate of the capacitor 208.

The select gate electrode 202 comprises a first portion that extends in the first direction 214 from the first portion 102a of the substrate 102 to the isolation structure 204. The select gate electrode 202 further comprises a second portion connected to the first portion at a position overlying the isolation structure 204 that extends over the isolation structure 204 in the second direction 216.

A plurality of contacts 206 is disposed over the substrate 102 and the select gate electrode 202. A first contact 206a of the plurality of contacts 206 electrically couples a source region of the doped regions of the first portion 102a of the substrate 102 to an overlying source line SL. In some embodiments, the source line SL extends in the second direction 216. A second contact 206b of the plurality of contacts 206 is disposed on a drain region of the doped regions of the first portion 102a of the substrate 102 and is electrically coupled to an overlying bit line BL. In some embodiments, the bit line BL extends in the second direction 216.

A third contact 206c of the plurality of contacts 206 electrically couples the select gate electrode 202 to an overlying select gate line SGL. In some embodiments, the select gate line SGL extends in the first direction 214. A fourth contact 206d of the plurality of contacts 206 electrically couples one of the doped regions of the second portion 102b of the substrate 102 to an overlying control gate line CGL. In some embodiments, the control gate line CGL extends in the first direction 214.

In some embodiments, the top view 200B represents a single MTP memory cell. In further embodiments, an IC may comprise a plurality of similar memory cells arranged into a plurality of rows and a plurality of columns. In some embodiments, the memory cell may be in a 2T1C configuration. In some embodiments, operation of the memory cell may be as described with respect to FIG. 2A.

In some embodiments, a CESL structure (not shown) may continuously extend over the select gate electrode 202, the insulating stack 116, the substrate 102, and the isolation structure 204. In alternative embodiments, sidewall spacers (not shown) may be disposed along sidewalls of the select gate electrode 202 and sidewalls of the floating gate electrode 104.

In some embodiments, the select gate electrode 202 may be or comprise, for example, doped polysilicon, metal, or some other suitable material(s). In some embodiments, the isolation structure 204 may be or comprise, for example, silicon nitride, silicon dioxide, some other suitable dielectric material(s), or a combination of the foregoing. In some embodiments, the plurality of contacts 206, the source line SL, the bit line BL, the control gate line CGL, and/or the select gate line SGL may be or comprise, for example, copper, iron, some other suitable conductive material(s), or a combination of the foregoing. In some embodiments, the coupling segment 210 and the top capacitor plate 208a of the capacitor 208 may be or comprise, for example, doped polysilicon, metal, or some other suitable material(s).

FIG. 3 illustrates a cross-sectional view 300 of some embodiments of an IC comprising a select gate electrode 202 and an insulating stack 116 separating a floating gate electrode 104 from a CESL structure 122. In some embodiments, the cross-sectional view 300 is taken across a line A-A' of FIG. 2B. The floating gate electrode (FG) 104 and the select gate electrode (SG) 202 are laterally separated from one another and disposed over a substrate 102. Sidewall spacers 106, 302 are disposed respectively on opposing sidewalls of the floating gate electrode 104 and on opposing sidewalls of the select gate electrode 202. A floating gate dielectric layer 108 separates the floating gate electrode 104 from the substrate 102. A select gate dielectric layer 304 separates the select gate electrode 202 from the substrate 102.

A plurality of silicide layers 124 is disposed along a top surface of the substrate 102 and a top surface of the select gate electrode 202. A dielectric structure 128 is disposed over the CESL structure 122. Doped regions 126 of the substrate 102 are disposed respectively on opposing sides of the floating gate electrode 104 and the select gate electrode 202. The floating gate electrode 104 and the select gate electrode 202 share a common doped region 126c of the substrate 102. In some embodiments, the doped regions 126 have a first doping type (e.g., n-type). The select gate transistor 201 comprises the select gate electrode 202 and the doped regions 126. The floating gate transistor 101 comprises the floating gate electrode 104 and the doped regions 126.

In some embodiments, the plurality of silicide layers 124 is disposed on the doped regions 126 of the substrate 102. In some embodiments, the plurality of silicide layers 124 directly contact the CESL structure 122. A plurality of contacts 206 vertically extend through the dielectric structure 128 and the CESL structure 122 to contact the plurality of silicide layers 124 disposed on the doped regions 126. In some embodiments. this provides an electrical connection between the doped regions 126 and overlying source/bit lines (not shown).

In some embodiments, the substrate 102 comprises a doped well region 310 having a second doping type (e.g., p-type) opposite the first doping type. In further embodiments, the doped regions 126 of the substrate 102 are disposed in the doped well region 310. In some embodiments, a bulk semiconductor layer 306 having the second doping type is disposed below the doped well region 310. In some embodiments, a doped buried layer 308 is disposed below the bulk semiconductor layer 306. In further embodiments, the doped buried layer 308 has the first doping type.

The CESL structure 122 comprises a plurality of oxide layers and a plurality of nitride layers alternatingly stacked over the floating gate electrode 104 and the substrate 102. In some embodiments, the plurality of oxide layers comprises no more than two layers. In some embodiments, the plurality of nitride layers comprises no more than two layers. For example, in the illustrated embodiment, the CESL structure 122 comprises a lower oxide layer 118a, a lower nitride layer 120a over the lower oxide layer 118a, an upper oxide layer 118b over the lower nitride layer 120a, and an upper nitride layer 120b over the upper oxide layer 118b. In some embodiments, the CESL structure 122 is conformally disposed over the insulating stack 116. In some embodiments, the CESL structure 122 is highly stressed, and provides a tensile stress on a channel region of the substrate 102 to improve saturated drive current. The CESL structure 122 continuously extends over the floating gate electrode 104 and the select gate electrode 202.

The insulating stack 116 separates the CESL structure 122 from the floating gate electrode 104. The insulating stack 116 comprises a first resist protective layer 110 disposed over the floating gate electrode 104, a second resist protective layer 114 disposed over the first resist protective layer 110, and an insulating layer 112 separating the first resist protective layer 110 from the second resist protective layer 114. The first resist protective layer 110 extends along a curved surface of the sidewall spacers 106 from above the floating gate electrode 104 to the substrate 102. In some embodiments, the first resist protective layer 110 directly overlies the doped regions 126 of the substrate 102. In some embodiments, the CESL structure 122 separates the select gate electrode 202 from the insulating stack 116 in a lateral direction.

The first resist protective layer 110 comprises a first outer sidewall 110a and a second outer sidewall 110b, the insulating layer 112 comprises a first outer sidewall 112a and a second outer sidewall 112b, and the second resist protective layer 114 comprises a first outer sidewall 114a and a second outer sidewall 114b. In some embodiments, the first outer sidewall 114a or the second outer sidewall 114b of the second resist protective layer 114 extends below an upper surface of the insulating layer 112. In some embodiments, the first outer sidewall 112a and the second outer sidewall 112b of the insulating layer 112 are respectively aligned with the first outer sidewall 114a and the second outer sidewall 114b of the second resist protective layer 114 along a substantially vertical axis. In some embodiments, the first outer sidewall 110a of the first resist protective layer 110 faces the select gate electrode 202. In some embodiments, the first outer sidewall 110a of the first resist protective layer 110 extends to a position laterally outside of the first outer sidewall 112a of the insulating layer 112. In some embodiments, the first outer sidewall 110a of the first resist protective layer 110 is an outermost sidewall of the resist protective layer 110, and terminates between an edge of the select gate electrode 202 and a nearest neighboring edge of the floating gate electrode 104 without extending over the select gate electrode 202.

The insulating stack 116 has a first thickness T1 as measured over the floating gate electrode 104. The CESL structure 122 has a second thickness T2 as measured over the floating gate electrode 104. In some embodiments, the first thickness T1 is greater than the second thickness T2. In some embodiments, the first thickness T1 is large enough to provide a sufficient separation between the floating gate electrode 104 and the CESL structure 122.

Since the floating gate electrode 104 is separated from the CESL structure 122 by an insulating stack 116 comprising multiple layers, there is a sufficient distance (e.g., the first thickness T1) between the CESL structure 122 and the floating gate electrode 104 to ensure that an unintended capacitive effect between the CESL structure 122 and the floating gate electrode 104 is lessened in comparison to an IC that does not comprise an insulating stack. Therefore, the data retention degradation of the device is lessened.

FIG. 4 illustrates a cross-sectional view 400 of some embodiments of an IC comprising an insulating stack 116 separating a capacitor 208 from a CESL structure 122. In some embodiments, the cross-sectional view 400 is taken across a line B-B' of FIG. 2B. The capacitor 208 overlies a substrate 102. In some embodiments, the floating gate electrode 104 as described with respect to FIG. 3 is connected to the top capacitor plate 208a of the capacitor 208 by a coupling segment 210 (see FIGS. 2A-2B). Doped regions 126 of the substrate 102 are disposed respectively on opposing sides of the top capacitor plate 208a of the capacitor 208. In some embodiments, the doped regions 126 have a first doping type (e.g., n-type). A doped capacitor region 402 of the substrate 102 serves as a bottom capacitor plate 208b of the capacitor 208. In further embodiments, the doped regions 126 of the substrate 102 are disposed in the doped capacitor region 402. Sidewall spacers 406 are disposed respectively on opposing sidewalls of the top capacitor plate 208a of the capacitor 208. A capacitor dielectric layer 404 separates the top capacitor plate 208a of the capacitor 208 from the substrate 102.

In some embodiments, the substrate 102 comprises a doped well region 310 having a second doping type (e.g., p-type) opposite the first doping type. In some embodiments, a bulk semiconductor layer 306 having the second doping type is disposed below the doped well region 310. In some embodiments, a doped buried layer 308 is disposed below the bulk semiconductor layer 306. In further embodiments, the doped buried layer 308 has the first doping type.

A dielectric structure 128 is disposed over the CESL structure 122. A plurality of silicide layers 124 is disposed on the doped regions 126 of the substrate 102. In some embodiments, the plurality of silicide layers 124 directly contact the CESL structure 122. A contact 206d vertically extends through the dielectric structure 128 and the CESL structure 122 to contact one of the silicide layers 124 disposed on one of the doped regions 126. In some embodiments, this provides an electrical connection between the one of the doped regions 126 and an overlying control gate line CGL.

In some embodiments, the doped capacitor region 402 has a same doping type as the doped regions 126 (e.g., the first doping type). In some of such embodiments, the doped capacitor region 402 is more lightly doped than the doped regions 126. In some embodiments, by applying an electrical bias to the contact 206d, the doped capacitor region 402 is charged.

The CESL structure 122 comprises a plurality of oxide layers and a plurality of nitride layers alternatingly stacked over the top capacitor plate 208a of the capacitor 208 and the substrate 102. In some embodiments, the plurality of oxide layers comprises no more than two layers. In some embodiments, the plurality of nitride layers comprises no more than two layers. For example, in the illustrated embodiment, the CESL structure 122 comprises a lower oxide layer 118a, a lower nitride layer 120a over the lower oxide layer 118a, an upper oxide layer 118b over the lower nitride layer 120a, and an upper nitride layer 120b over the upper oxide layer 118b. In some embodiments, the CESL structure 122 is conformally disposed over the insulating stack 116. The insulating stack 116 separates the CESL structure 122 from the floating gate electrode 104. The insulating stack 116 comprises a first resist protective layer 110 disposed over the top capacitor plate 208a of the capacitor 208, a second resist protective layer 114 disposed over the first resist protective layer 110, and an insulating layer 112 separating the first resist protective layer 110 from the second resist protective layer 114. The first resist protective layer 110 extends along a curved surface of the sidewall spacers 406 from above the top capacitor plate 208a of the capacitor 208 to the doped capacitor region 402. In some embodiments, the first resist protective layer 110 directly overlies the doped regions 126.

The insulating stack 116 has a first thickness T1 as measured over the top capacitor plate 208a of the capacitor 208. The CESL structure 122 has a second thickness T2 as measured over the top capacitor plate 208a of the capacitor 208. In some embodiments, the first thickness T1 is greater than the second thickness T2. In some embodiments, the first thickness T1 is large enough to provide a sufficient separation between the top capacitor plate 208a of the capacitor 208 and the CESL structure 122.

Figure 5:
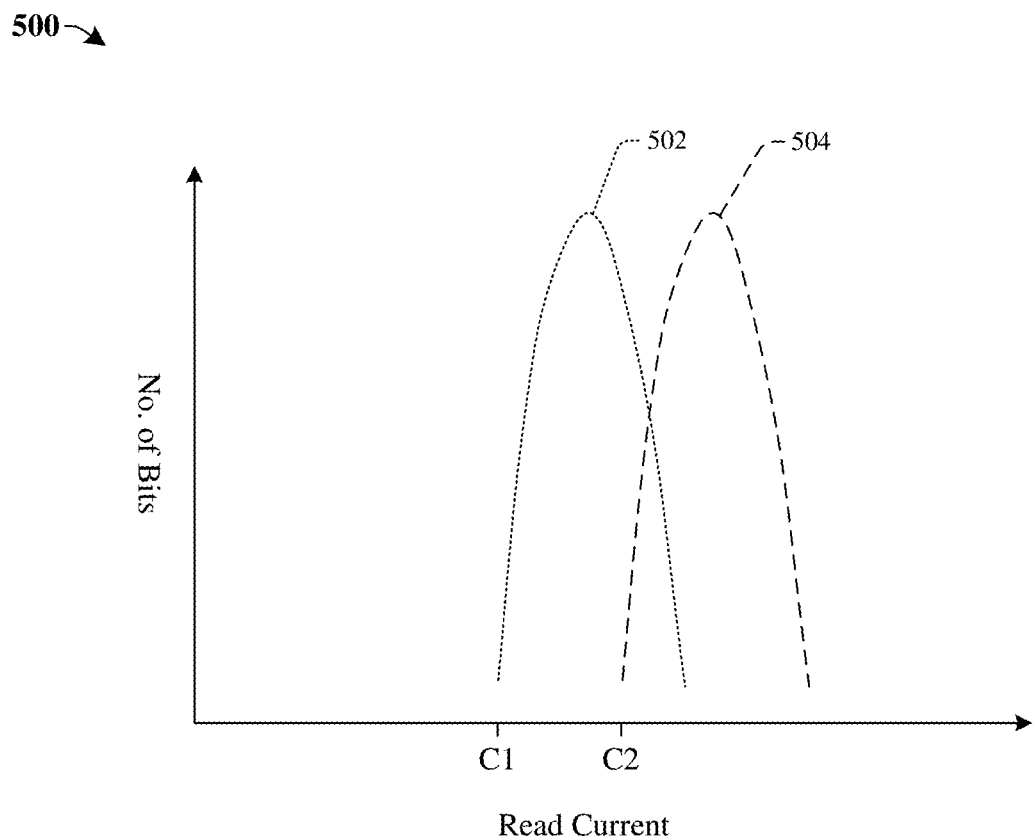
FIG. 5 illustrates a graphical representation of data retention of an IC comprising an insulating stack separating a floating gate electrode from a CESL structure.

FIG. 5 illustrates a graphical representation 500 of data retention of an IC comprising an insulating stack separating a floating gate electrode from a CESL structure. In some embodiments, the IC may be as described with respect to FIGS. 2-4. Curve 502 represents data retention of a baseline IC after undergoing a heating process, the baseline IC not comprising an insulating stack separating a floating gate electrode from a CESL structure. Curve 504 represents data retention of an IC after undergoing a heating process, the IC comprising an insulating stack separating a floating gate electrode from a CESL structure. In some embodiments, the heating process may comprise baking the IC at a temperature of approximately 250 degrees Celsius for a time of approximately 24 hours.

Curve 502 has a first minimum read current C1, and curve 504 has a second minimum read current C2 that is greater than the first minimum read current C1. Since curve 502 corresponds to an IC that does not comprise the insulating stack, after undergoing the baking process, charges within the CESL structure diffuse according to an electric field produced by the floating gate electrode, leading to an unintended capacitive effect between the floating gate electrode and the CESL structure. As such, charges stored in the floating gate electrode are screened by the CESL structure, decreasing the threshold voltage for a memory cell in the programmed state, and increasing the threshold voltage for a memory cell in the erased state. This decreases the read current across the bit line and the data retention of the memory cell.

Since curve 504 corresponds to an IC that does comprise the insulating stack, after undergoing the baking process, fewer charges within the CESL structure diffuse according to an electric field produced by the floating gate electrode, leading to a decrease in the unintended capacitive effect between the floating gate electrode and the CESL structure. As such, the threshold voltage decreases by less for a memory cell in the programmed state, and increases the less for a memory cell in the erased state. Thus, the read current across the bit line and the data retention of the memory cell are improved as compared to the baseline IC.

FIGS. 6-24 illustrate a series of cross-sectional views 600-2400 of some embodiments of a method for forming an IC comprising a floating gate electrode 104, a select gate electrode 202, and an insulating stack 116 separating the floating gate electrode 104 from a CESL structure 122. In some embodiments, the IC may correspond to the IC described in FIG. 3.

Figure 6:
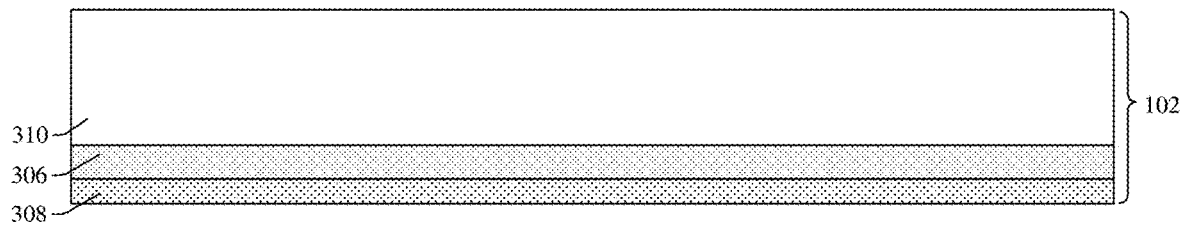
FIGS. 6-24 illustrate a series of cross-sectional views of some embodiments of a method for forming an IC comprising a floating gate electrode, a select gate electrode, and an insulating stack separating the floating gate electrode from a CESL structure.

With respect to cross-sectional view 600 of FIG. 6, in some embodiments, a doped buried layer 308 is formed in a substrate 102 by a first doping process. A doped well region 310 is formed in the substrate 102 over the doped buried layer 308 by a second doping process. In some embodiments, the first doping process comprises implanting dopants having a first doping type (e.g., arsenic, phosphorus, or some other suitable n-type dopants) into the substrate 102. In alternative embodiments, the doped buried layer 308 may be formed by an epitaxial growth process. In some embodiments, the second doping process comprises implanting dopants having a second doping type (e.g., boron or some other suitable p-type dopants) opposite the first doping type into the substrate 102. In some embodiments, a bulk semiconductor layer 306 is a portion of the substrate 102 not doped by the first doping process or the second doping process disposed between doped buried layer 308 and the doped well region 310. In further embodiments, the bulk semiconductor layer 306 having the second doping type.

Figure 7:
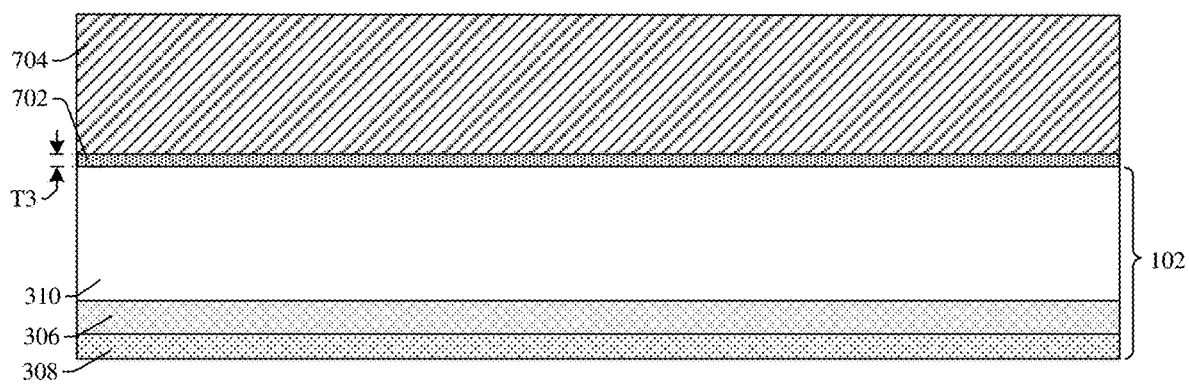

With respect to cross-sectional view 700 of FIG. 7, a gate dielectric structure 702 is formed over the substrate 102. A gate electrode structure 704 is formed over the gate dielectric structure 702. In some embodiments, the gate dielectric structure 702 may be formed by a deposition process such as, for example, physical vapor deposition (PVD), chemical vapor deposition (CVD), or some other suitable deposition process. In some embodiments, the gate electrode structure 704 may be formed by a deposition process (e.g., PVD, CVD, or the like) and/or a plating process (e.g., electroplating, electro-less plating, or the like).

The gate dielectric structure 702 is formed to have a third thickness T3. In some embodiments, the third thickness T3 may range from approximately 100 Angstroms to approximately 150 Angstroms, from approximately 100 Angstroms to approximately 125 Angstroms, from approximately 125 Angstroms to approximately 150 Angstroms, or some other suitable value.

Figure 8:
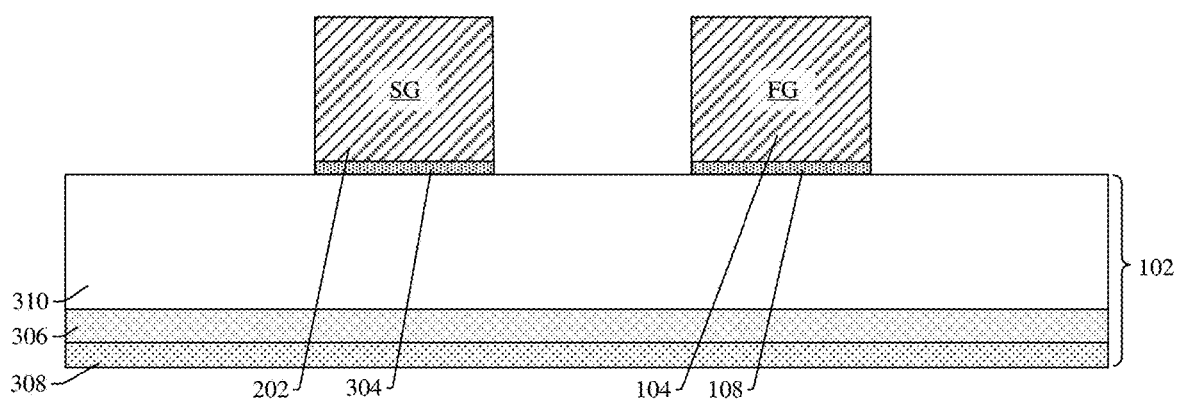

With respect to cross-sectional view 800 of FIG. 8, the gate dielectric structure 702 and the gate electrode structure 704 are patterned by an etching process. The etching process respectively forms a floating gate electrode (FG) 104 overlying a floating gate dielectric layer 108 and a select gate electrode (SG) 202 overlying a select gate dielectric layer 304. In some embodiments, the etching process may comprise, for example, a wet etching process and/or a dry etching process. In various embodiments, the wet etching process comprises exposing portions of the gate dielectric structure 702 and/or the gate electrode structure 704 to a wet etchant (e.g., tetramethylammonium hydroxide (TMAH)). In various embodiments, the dry etching process comprises exposing portions of the gate dielectric structure 702 and/or the gate electrode structure 704 to a dry etchant (e.g., chlorine gas ($H_2$), gaseous hydrochloric acid (HCl), or germane gas ($GeH_4$)).

Figure 9:
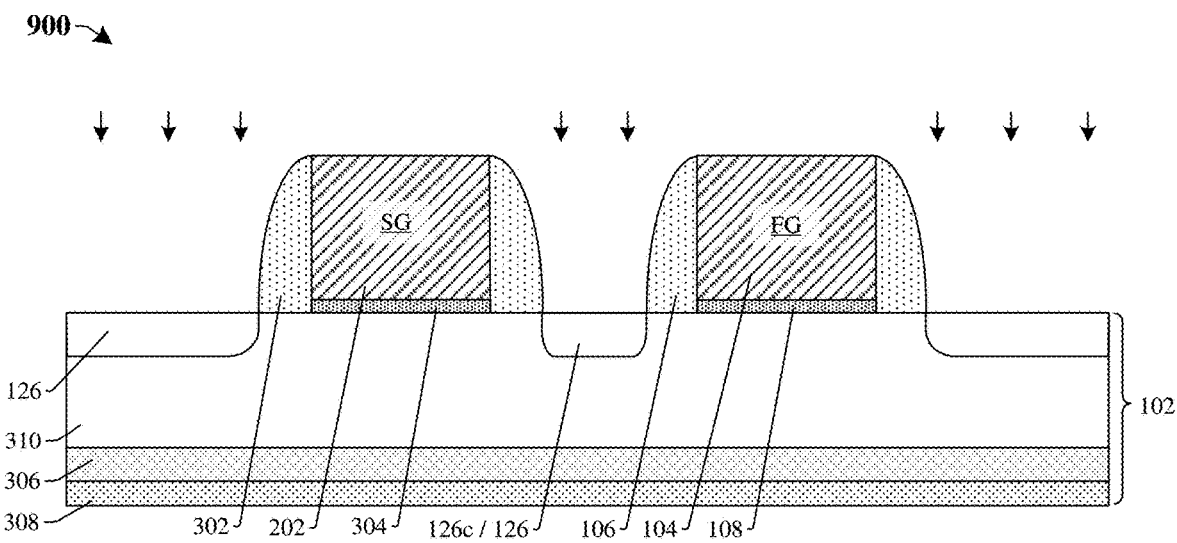

With respect to cross-sectional view 900 of FIG. 9, sidewall spacers 106 are formed on opposing sidewalls of the floating gate electrode 104 and sidewall spacers 302 are formed on opposing sidewalls of the select gate electrode 202. Doped regions 126 are formed in the substrate 102 by a doping process. In some embodiments, the sidewall spacers 106, 302 may be formed by a conformal deposition process (e.g., PVD, CVD, or the like) that puts down a conformal layer, followed by an etch back to remove lateral portions of the conformal layer to leave sidewall spacers 106, 302. In some embodiments, the doping process comprises implanting dopants having a first doping type (e.g., phosphorous, arsenic, or some other suitable n-type dopants) into a top surface of the substrate 102 such that the sidewall spacers 106, 302, the select gate electrode 202, and the floating gate electrode 104 act as a masking structure. In some embodiments, the doped regions 126 are formed into the doped well region 310 of the substrate 102. In some embodiments, an anneal process (e.g., rapid thermal anneal or the like) may be performed to activate and/or drive-in the dopants in the doped regions 126. In some embodiments, the floating gate electrode 104 and the select gate electrode 202 share a common doped region 126c.

Figure 10:
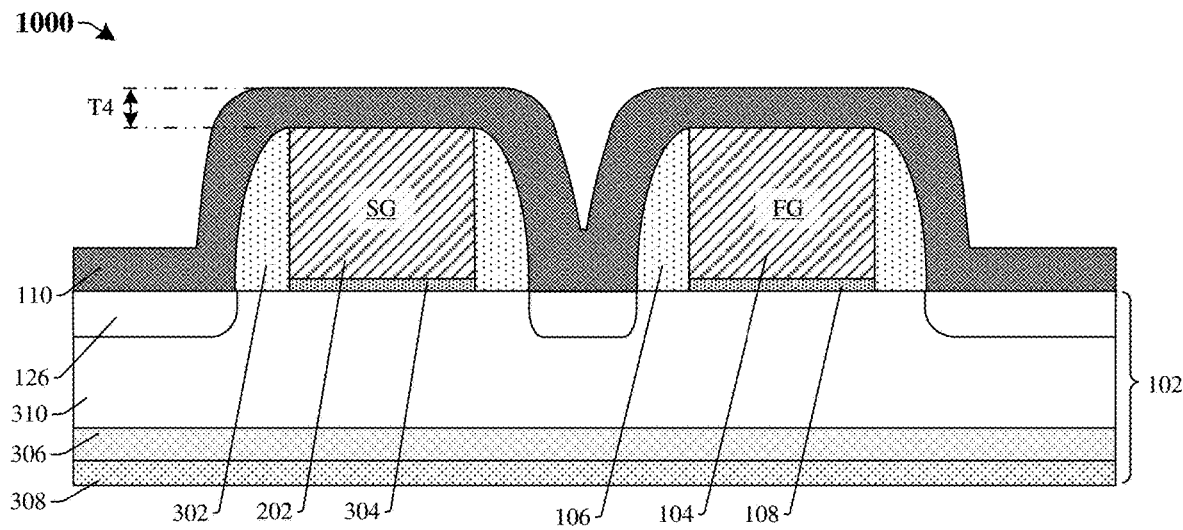

With respect to cross-sectional view 1000 of FIG. 10, a first resist protective layer 110 is formed over the substrate 102, the select gate electrode 202, and the floating gate electrode 104. In some embodiments, the first resist protective layer 110 is formed conformally over the select gate electrode 202, the floating gate electrode 104, and the sidewall spacers 106, 302. In some embodiments, the first resist protective layer 110 may be formed by a deposition process (e.g., PVD, CVD, or the like).

The first resist protective layer 110 is formed to have a fourth thickness T4. In some embodiments, the fourth thickness T4 may range from approximately 500 Angstroms to approximately 1500 Angstroms, from approximately 500 Angstroms to approximately 850 Angstroms, from approximately 850 Angstroms to approximately 1500 Angstroms, or some other suitable value.

Figure 11:
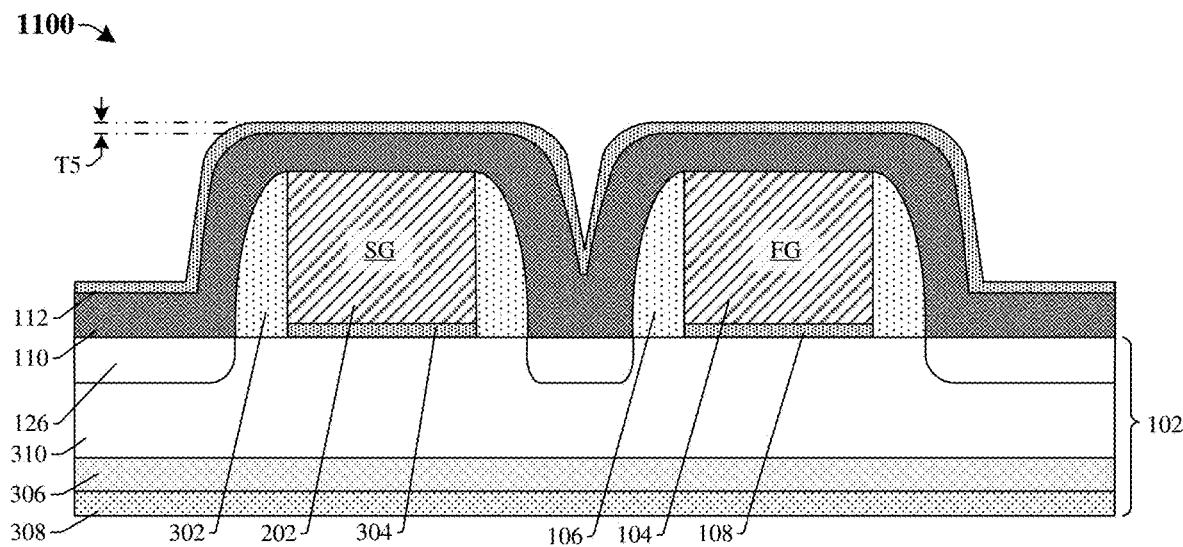

With respect to cross-sectional view 1100 of FIG. 11, an insulating layer 112 is formed over the first resist protective layer 110. In some embodiments, the insulating layer 112 is formed conformally over the first resist protective layer 110. In some embodiments, the insulating layer 112 may be formed by a deposition process (e.g., PVD, CVD, or the like).

The insulating layer 112 is formed to have a fifth thickness T5. In some embodiments, the fifth thickness T5 may range from approximately 100 Angstroms to approximately 200 Angstroms, from approximately 100 Angstroms to approximately 175 Angstroms, from approximately 175 Angstroms to approximately 200 Angstroms, or some other suitable value.

Figure 12:
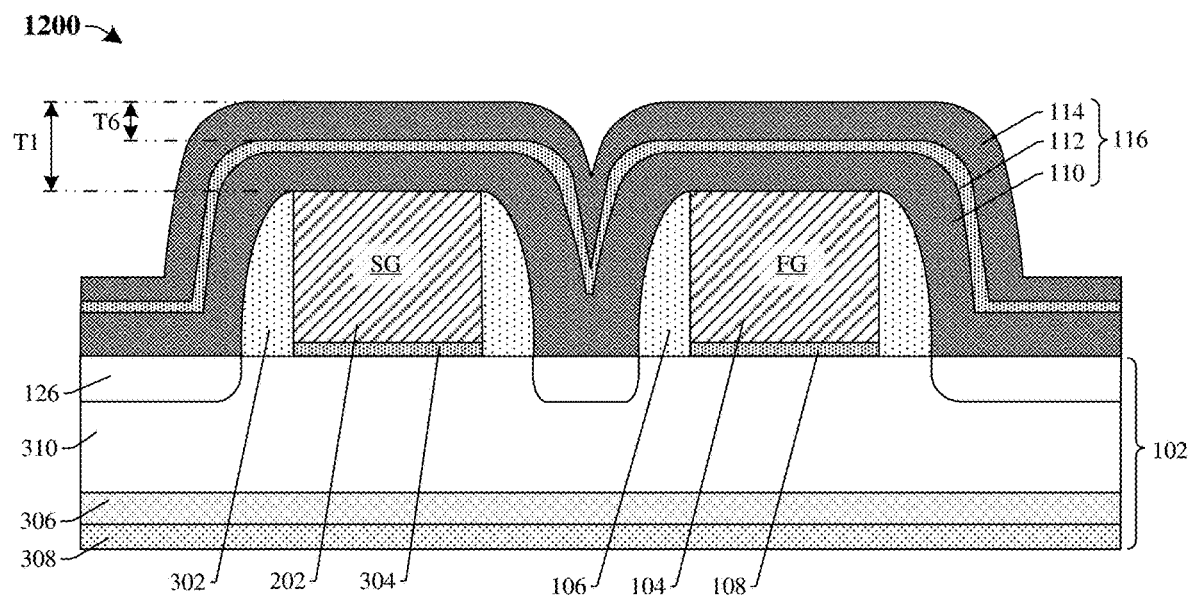

With respect to cross-sectional view 1200 of FIG. 12, a second resist protective layer 114 is formed over the insulating layer 112. In some embodiments, the second resist protective layer 114 is formed conformally over the insulating layer 112. In some embodiments, the second resist protective layer 114 may be formed by a deposition process (e.g., PVD, CVD, or the like).

The second resist protective layer 114 is formed to have a sixth thickness T6. In some embodiments, the sixth thickness T6 may range from approximately 500 Angstroms to approximately 1500 Angstroms, from approximately 500 Angstroms to approximately 850 Angstroms, from approximately 850 Angstroms to approximately 1500 Angstroms, or some other suitable value. In some embodiments, the sixth thickness T6 is equal to the fourth thickness T4.

The first resist protective layer 110, the insulating layer 112, and the second resist protective layer 114 define an insulating stack 116. The insulating stack has a first thickness T1. In some embodiments, the first thickness T1 may range from approximately 1100 Angstroms to approximately 3200 Angstroms, from approximately 1875 Angstroms to approximately 3200 Angstroms, from approximately 1100 Angstroms to approximately 1875 Angstroms, or some other suitable value. Since the insulating stack 116 comprising multiple layers overlies the floating gate electrode 104, there is a sufficient distance (e.g., the first thickness T1) between the floating gate electrode 104 and a subsequently formed CESL structure to ensure that an unintended capacitive effect between the subsequently formed CESL structure and the floating gate electrode 104 is lessened in comparison to an IC that does not comprise an insulating stack. Therefore, the data retention degradation of the device is lessened.

In some embodiments, if the first thickness T1 is too large (e.g., greater than approximately 3200 Angstroms), portions of the insulating stack 116 may be too difficult to remove in subsequent steps. In some embodiments, if the first thickness T1 is too small (e.g., less than approximately 1100 Angstroms), the unintended capacitive effect between the subsequently formed CESL structure and the floating gate electrode 104 may not be sufficiently lessened in comparison to an IC that does not comprise an insulating stack.

Figure 13:
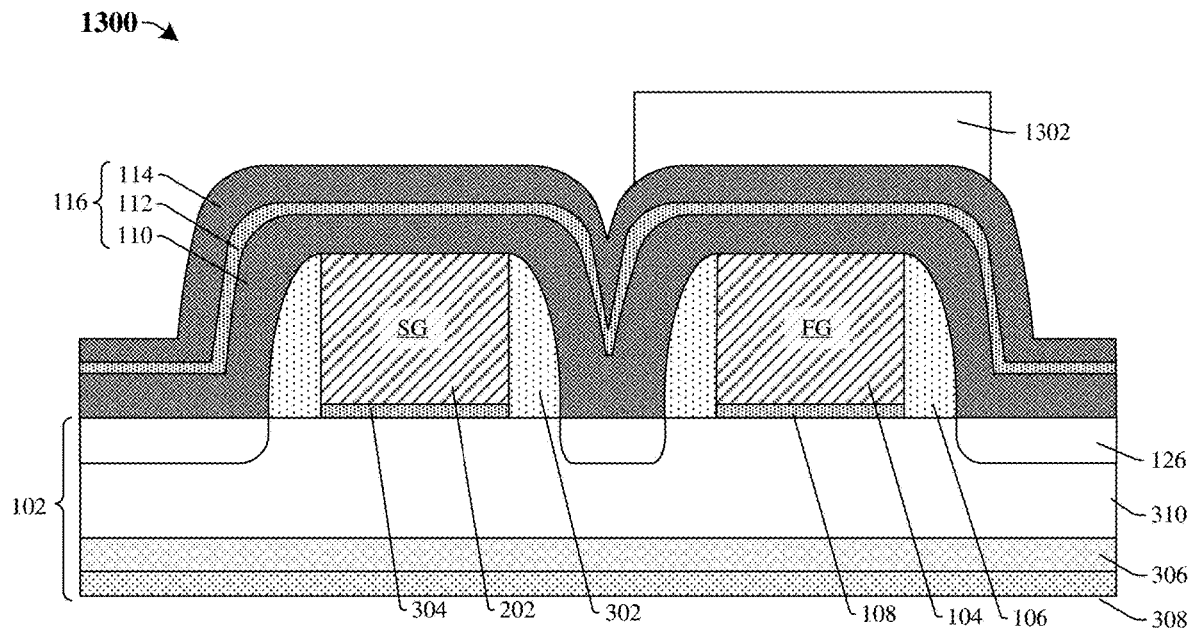

With respect to cross-sectional view 1300 of FIG. 13, a first photoresist structure 1302 is formed over the insulating stack 116 and the floating gate electrode 104, such that portions of the second resist protective layer 114 are exposed. In some embodiments, the first photoresist structure 1302 is laterally separated from the select gate electrode 202. In some embodiments, the first photoresist structure 1302 is a positive photoresist.

Figure 14:
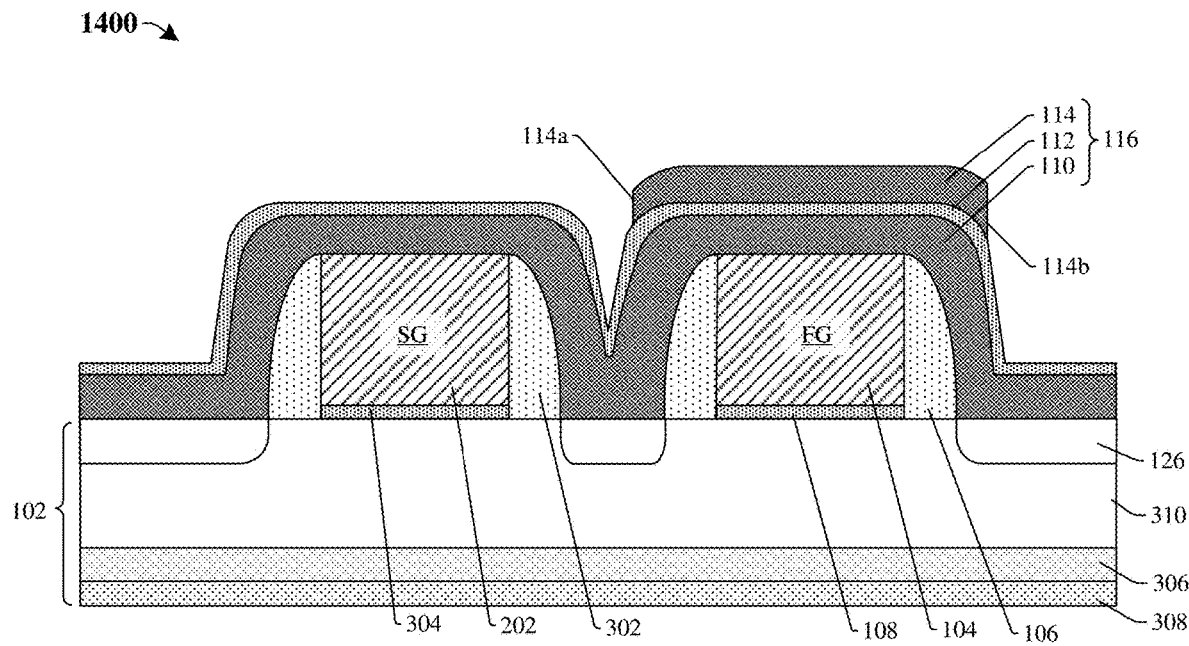

With respect to cross-sectional view 1400 of FIG. 14, an etching process is performed to remove the exposed portions of the second resist protective layer 114. In some embodiments, the etching process may comprise, for example, a wet etching process and/or a dry etching process. In various embodiments, the wet etching process comprises exposing the exposed portions of the second resist protective layer 114 to an isotropic wet etchant (e.g., dilute hydrofluoric acid (DHF)). In various embodiments, the dry etching process comprises exposing the exposed portions of the second resist protective layer 114 to an anisotropic dry etchant (e.g., chlorine gas ($H_2$), gaseous hydrochloric acid (HCl), or germane gas ($GeH_4$)). The etching process defines outer sidewalls 114a, 114b of the second resist protective layer 114 and exposes portions of the insulating layer 112. In some embodiments, one of the outer sidewalls 114a, 114b extends below the insulating layer 112.

Figure 15:
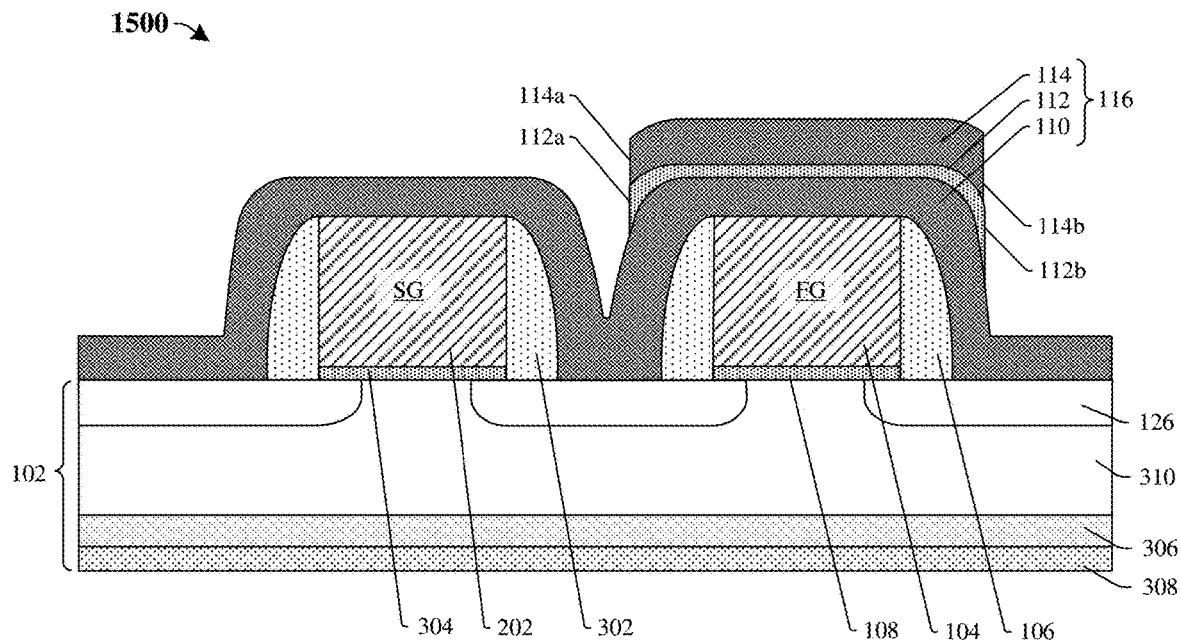

With respect to cross-sectional view 1500 of FIG. 15, an etching process is performed to remove the exposed portions of the insulating layer 112. In some embodiments, the etching process may comprise, for example, a wet etching process. In various embodiments, the wet etching process comprises exposing the exposed portions of the second resist protective layer 114 to an isotropic wet etchant (e.g., peroxymonophosphoric acid ($H_3PO_5$)). The etching process defines outer sidewalls 112a, 112b of the insulating layer 112. In some embodiments, the outer sidewalls 112a, 112b of the insulating layer 112 are respectively aligned with the outer sidewalls 114a, 114b of the second resist protective layer 114 along a substantially vertical axis.

Figure 16:
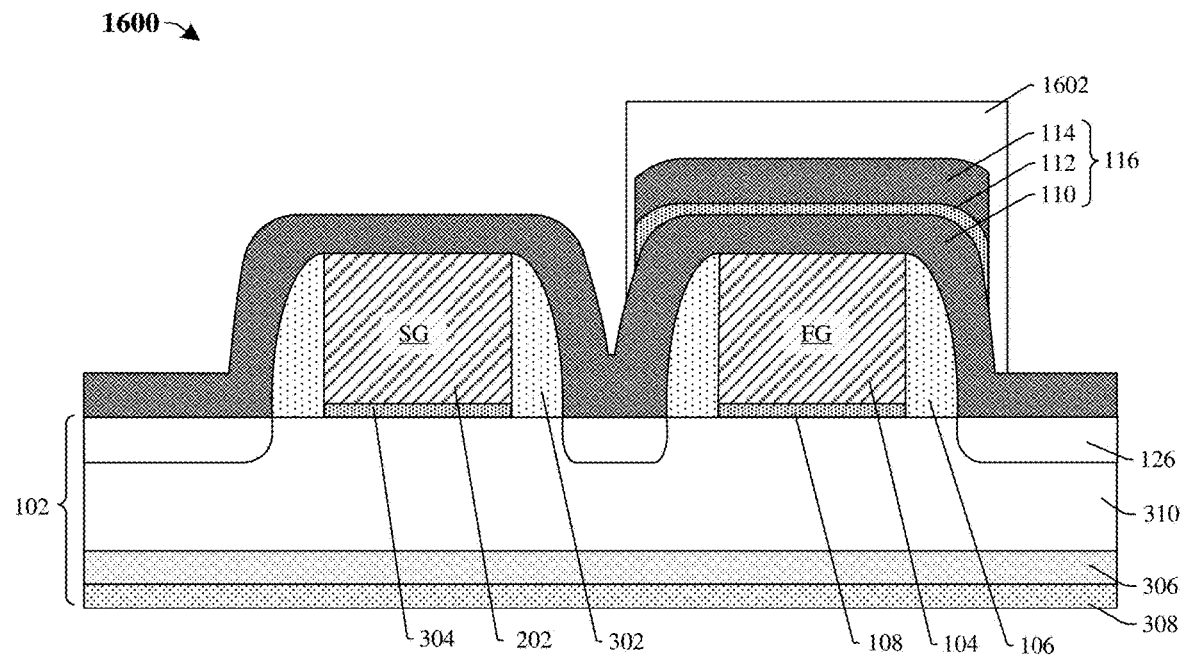

With respect to cross-sectional view 1600 of FIG. 16, a second photoresist structure 1602 is formed over the insulating stack 116 and the floating gate electrode 104, such that portions of the first resist protective layer 110 laterally separated from the floating gate electrode 104 remain exposed. In some embodiments, the second photoresist structure 1602 entirely covers the second resist protective layer 114 and the insulating layer 112. In some embodiments, the second photoresist structure 1602 is laterally separated from the select gate electrode 202. In some embodiments, the second photoresist structure 1602 is a positive photoresist.

Figure 17:
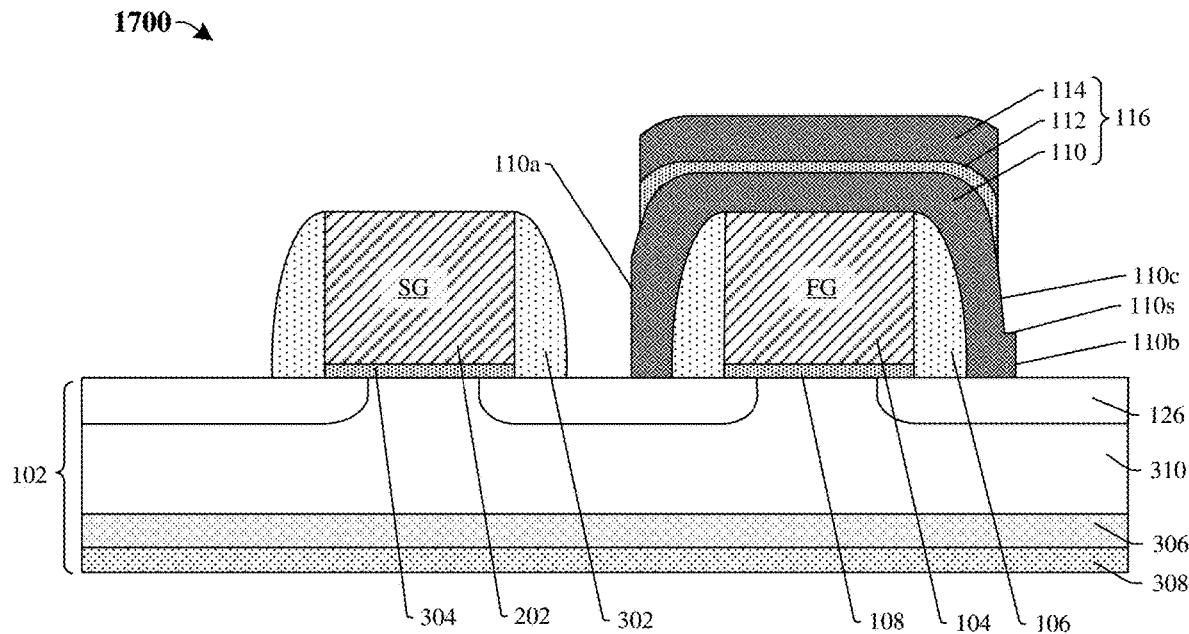

With respect to cross-sectional view 1700 of FIG. 17, an etching process is performed to remove the exposed portions of the first resist protective layer 110. The etching process exposes a top surface of the select gate electrode 202. In some embodiments, the etching process may comprise, for example, a wet etching process and/or a dry etching process. In various embodiments, the wet etching process comprises exposing the exposed portions of the first resist protective layer 110 to an isotropic wet etchant (e.g., dilute hydrofluoric acid (DHF)). In various embodiments, the dry etching process comprises exposing the exposed portions of the first resist protective layer 110 to an anisotropic dry etchant (e.g., chlorine gas ($H_2$), gaseous hydrochloric acid (HCl), or germane gas ($GeH_4$)). The etching process defines outer sidewalls 110a, 110b of the first resist protective layer 110. In further embodiments, the etching process further defines a third outer sidewall 110c of the first resist protective layer 110. In some embodiments, the second outer sidewall 110b and the third outer sidewall 110c are connected by a laterally extending surface 110s of the first resist protective layer 110.

Figure 18:
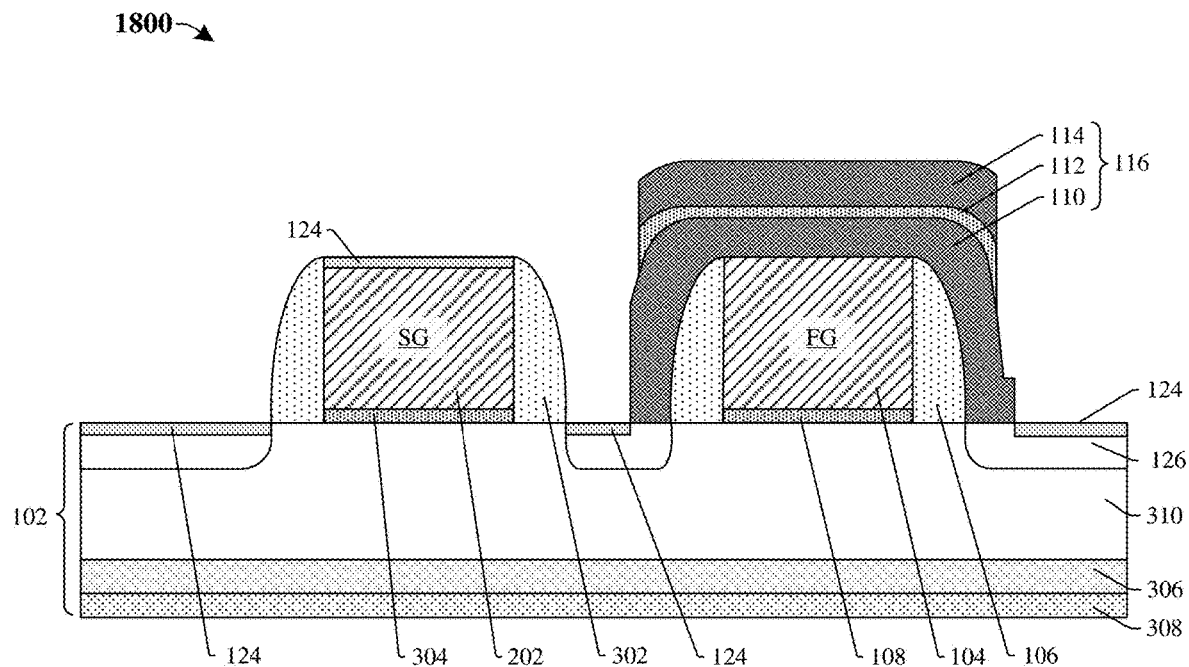

With respect to cross-sectional view 1800 of FIG. 18, a plurality of silicide layers 124 is formed over the substrate 102 and the exposed select gate electrode 202. In some embodiments, the plurality of silicide layers 124 may be formed by a salicidation process or some other suitable process. In some embodiments, the plurality of silicide layers 124 are formed over the doped regions 126 of the substrate 102 and along a top surface of the select gate electrode 202.

Figure 19:
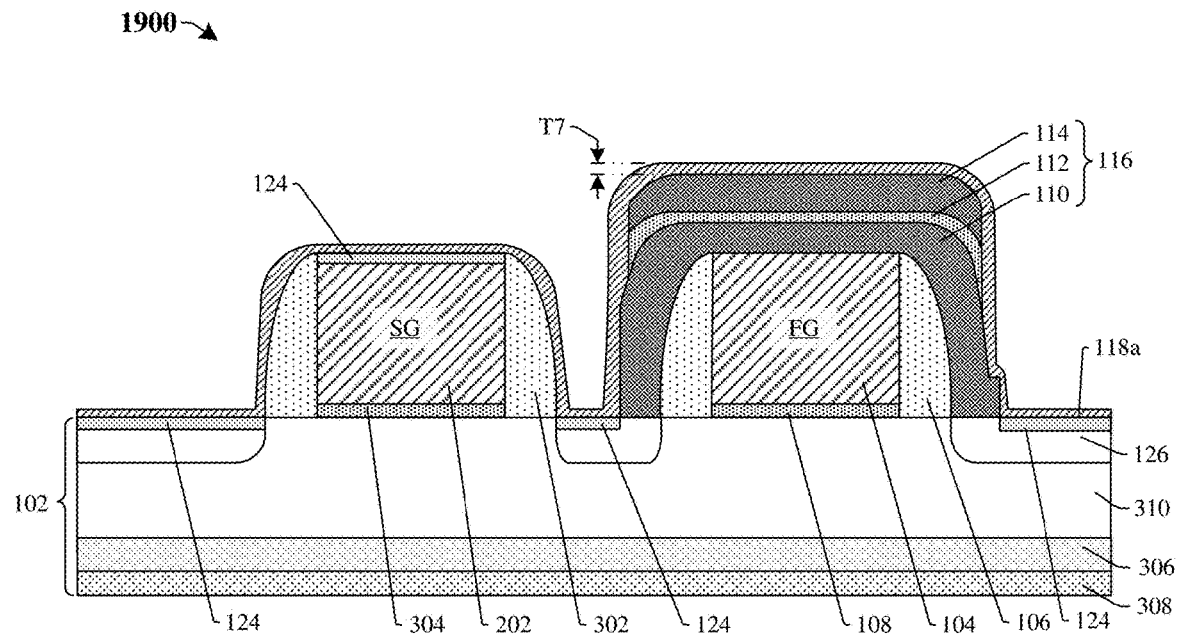

With respect to cross-sectional view 1900 of FIG. 19, a lower oxide layer 118a of a subsequently formed plurality of oxide layers is formed over the substrate 102, the select gate electrode 202, and the insulating stack 116. In some embodiments, the lower oxide layer 118a is formed conformally over the select gate electrode 202, the insulating stack 116, and the sidewall spacers 302. In some embodiments, the lower oxide layer 118a may be formed by a deposition process (e.g., PVD, CVD, or the like).

The lower oxide layer 118a is formed to have a seventh thickness T7. In some embodiments, the seventh thickness T7 may range from approximately 100 Angstroms to approximately 200 Angstroms, from approximately 100 Angstroms to approximately 150 Angstroms, from approximately 150 Angstroms to approximately 200 Angstroms, or some other suitable value.

Figure 20:
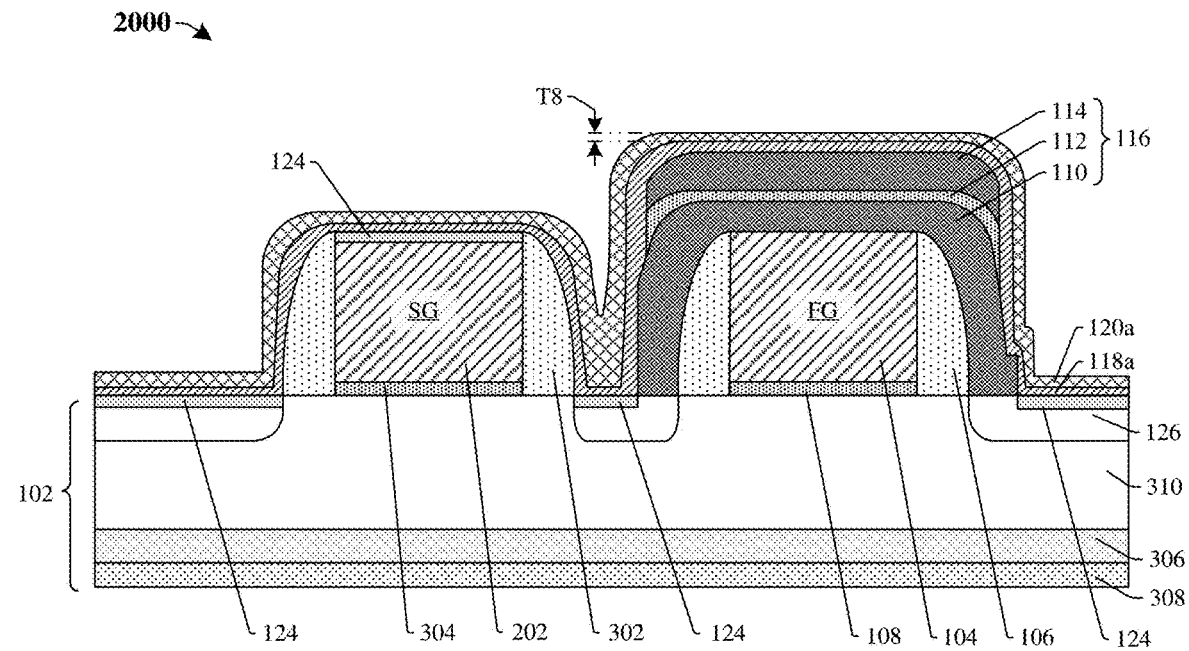

With respect to cross-sectional view 2000 of FIG. 20, a lower nitride layer 120a of a subsequently formed plurality of nitride layers is formed over the lower oxide layer 118a. In some embodiments, the lower nitride layer 120a is formed conformally over the lower oxide layer 118a. In some embodiments, the lower nitride layer 120a may be formed by a deposition process (e.g., PVD, CVD, or the like).

The lower nitride layer 120a is formed to have an eighth thickness T8. In some embodiments, the eighth thickness T8 may range from approximately 100 Angstroms to approximately 200 Angstroms, from approximately 100 Angstroms to approximately 175 Angstroms, from approximately 175 Angstroms to approximately 200 Angstroms, or some other suitable value.

Figure 21:
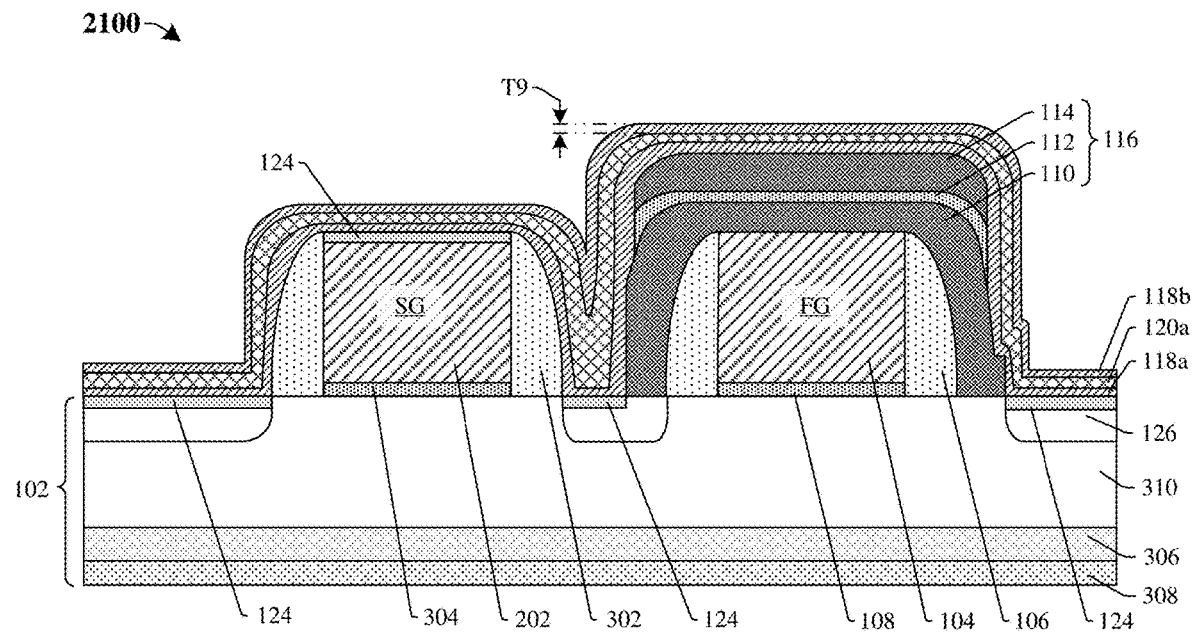

With respect to cross-sectional view 2100 of FIG. 21, an upper oxide layer 118b is formed over the lower nitride layer 120a to define a plurality of oxide layers. In some embodiments, the upper oxide layer 118b is formed conformally over the lower nitride layer 120a. In some embodiments, the upper oxide layer 118b may be formed by a deposition process (e.g., PVD, CVD, or the like).

The upper oxide layer 118b is formed to have a ninth thickness T9. In some embodiments, the ninth thickness T9 may range from approximately 25 Angstroms to approximately 100 Angstroms, from approximately 25 Angstroms to approximately 50 Angstroms, from approximately 50 Angstroms to approximately 100 Angstroms, or some other suitable value.

Figure 22:
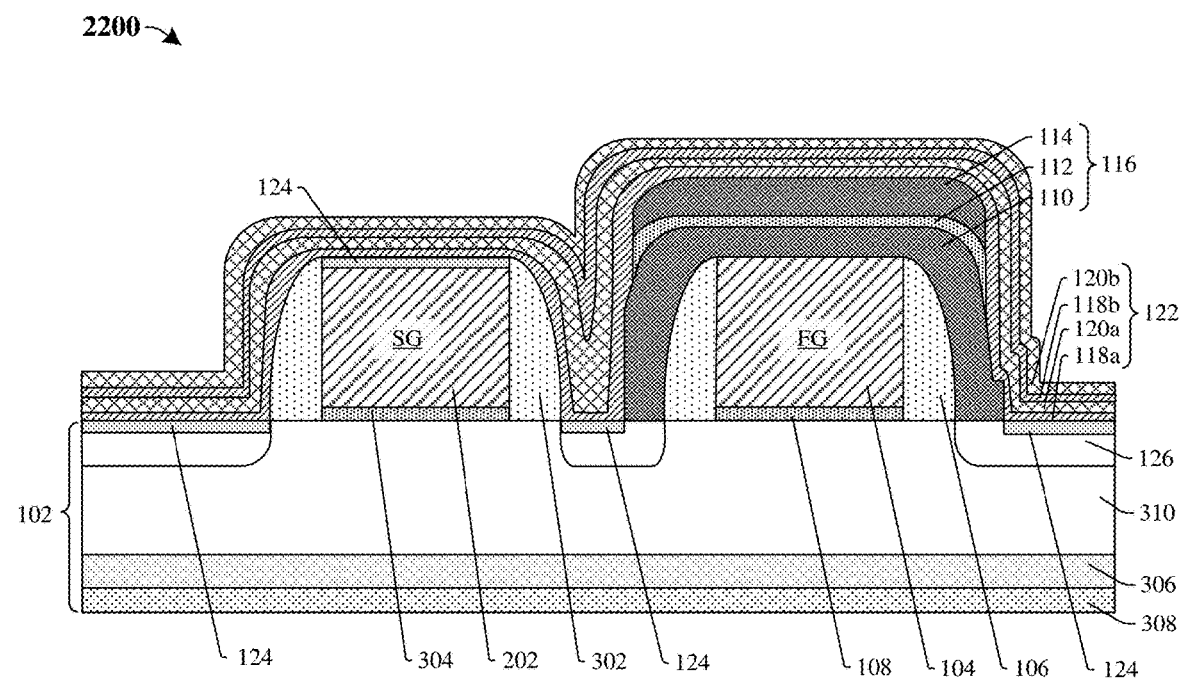

With respect to cross-sectional view 2200 of FIG. 22, an upper nitride layer 120b is formed over the upper oxide layer 118b to define a plurality of nitride layers. The plurality of oxide layers and the plurality of nitride layers define a CESL structure 122. In some embodiments, the CESL structure 122 is highly stressed, and provides a tensile stress on a channel region of the substrate 102 to improve saturated drive current. In alternative embodiments, forming the CESL structure 122 may comprise performing the steps as described with respect to FIG. 21 and/or FIG. 22 one or more additional times to increase a number of layers in the CESL structure 122. In some embodiments, the upper nitride layer 120b is formed conformally over the upper oxide layer 118b. In some embodiments, the upper nitride layer 120b may be formed by a deposition process (e.g., PVD, CVD, or the like). The upper nitride layer 120b is formed to have the eighth thickness T8. In some embodiments, the lower nitride layer 120a and/or the upper nitride layer 120b may have a same thickness (e.g., the fifth thickness T5, the eighth thickness T8) as the insulating layer 112.

Figure 23:
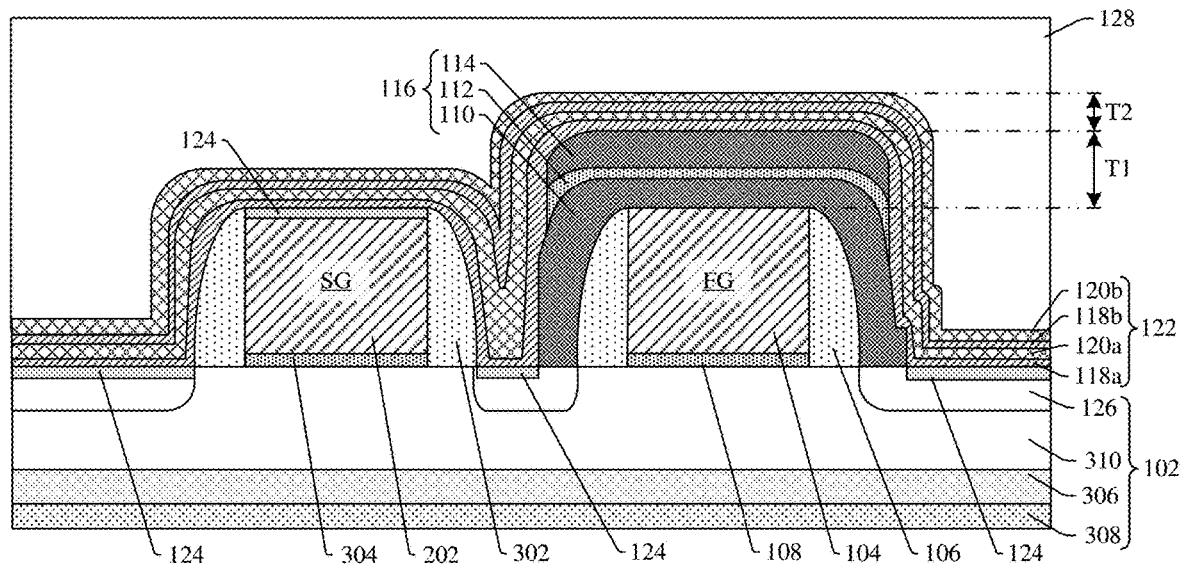

With respect to cross-sectional view 2300 of FIG. 23, a dielectric structure 128 is formed over the CESL structure 122. In some embodiments, the dielectric structure 128 may be formed by a deposition process (e.g., PVD, CVD, or the like).

Figure 24:
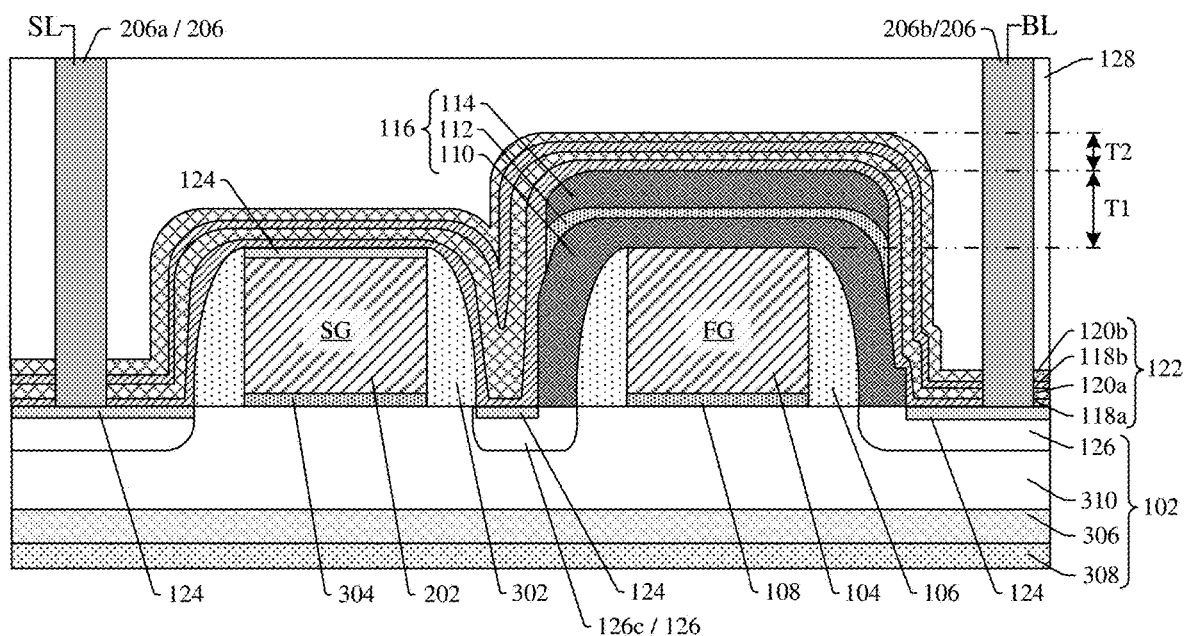

With respect to cross-sectional view 2400 of FIG. 24, a plurality of contacts 206 are formed within the dielectric structure 128 extending through the dielectric structure 128 and the CESL structure 122 to contact the plurality of silicide layers 124 overlying the doped regions 126. In some embodiments, the plurality of contacts 206 is electrically coupled to an overlying source line SL and an overlying bit line BL. The dielectric structure 128 and the CESL structure 122 are etched to form via holes and/or metal trenches. The via holes and/or metal trenches are then filled with a conductive material to form the plurality of contacts 206. In some embodiments, the plurality of contacts 206 may be formed using a deposition process and/or a plating process (e.g., electroplating, electro-less plating, etc.).

Figure 25:
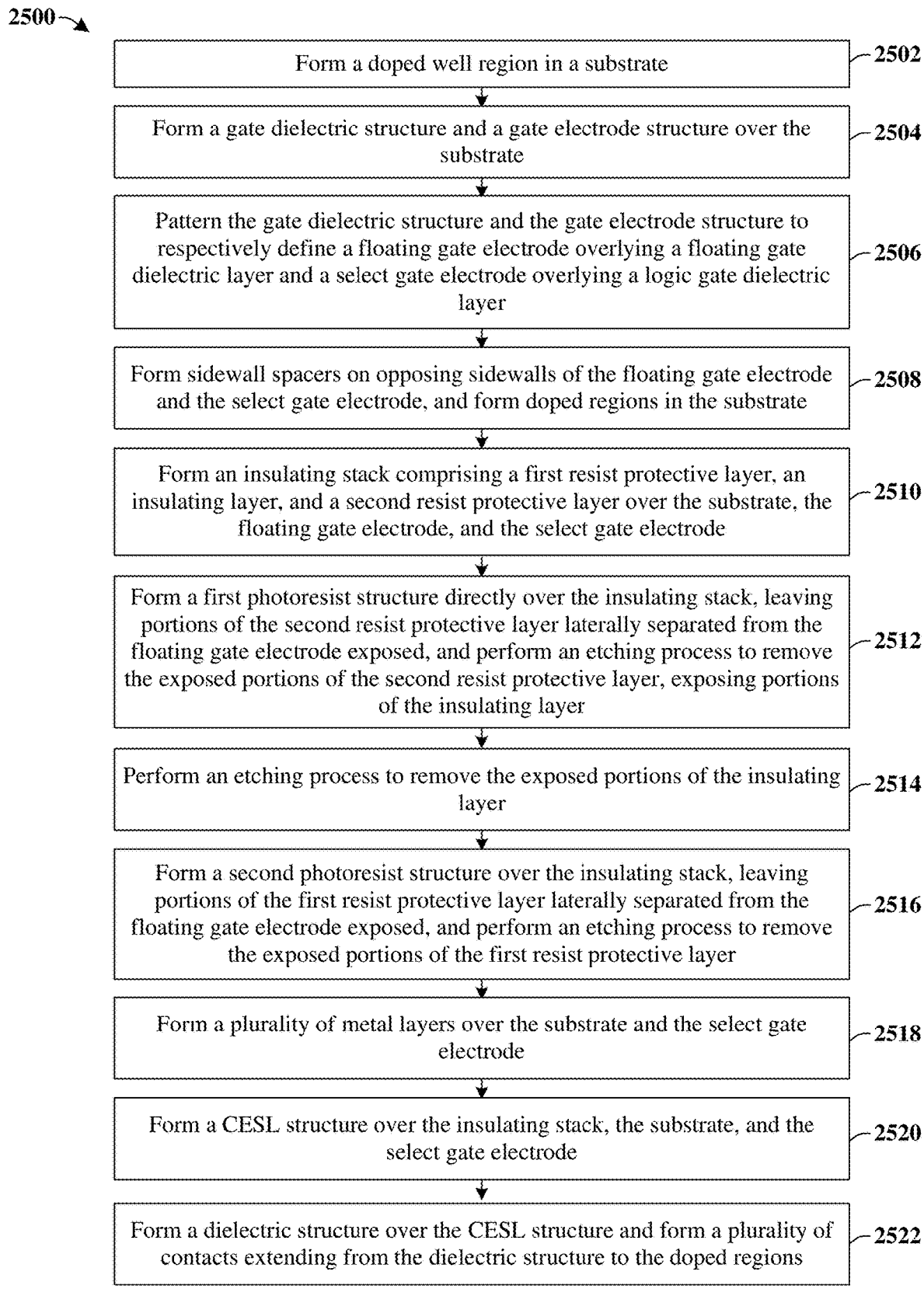
FIG. 25 illustrates a flowchart of some embodiments of the method described in FIGS. 6-24.

FIG. 25 illustrates a flowchart 2500 of some embodiments of a method for forming an IC comprising a floating gate electrode, a select gate electrode, and an insulating stack separating the floating gate electrode from a CESL structure. In some embodiments, the method may correspond to the method described in FIGS. 6-24.

While disclosed method of the flowchart 2500 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2502, a doped well region is formed in a substrate. See, for example, FIG. 6.

At act 2504, a gate dielectric structure and a gate electrode structure are formed over the substrate. See, for example, FIG. 7.

At act 2506, the gate dielectric structure and the gate electrode structure are patterned to respectively define a floating gate electrode overlying a floating gate dielectric layer and a select gate electrode overlying a select gate dielectric layer. See, for example, FIG. 8.

At act 2508, sidewall spacers are formed on opposing sidewalls of the floating gate electrode and the select gate electrode, and doped regions are formed in the substrate. See, for example, FIG. 9.

At act 2510, an insulating stack comprising a first resist protective layer, an insulating layer, and a second resist protective layer is formed over the substrate, the floating gate electrode, and the select gate electrode. See, for example, FIGS. 10-12.

At act 2512, a first photoresist structure is formed directly over the insulating stack, leaving portions of the second resist protective layer laterally separated from the floating gate electrode exposed, and an etching process is performed to remove the exposed portions of the second resist protective layer, exposing portions of the insulating layer. See, for example, FIGS. 13-14.

At act 2514, an etching process is performed to remove the exposed portions of the insulating layer. See, for example, FIG. 15.

At act 2516, a second photoresist structure is formed over the insulating stack, leaving portions of the first resist protective layer laterally separated from the floating gate electrode exposed, and an etching process is performed to remove the exposed portions of the first resist protective layer. See, for example, FIGS. 16-17.

At act 2518, a plurality of silicide layers is formed over the substrate and the select gate electrode. See, for example, FIG. 18.

At act 2520, a CESL structure is formed over the insulating stack, the substrate, and the select gate electrode. See, for example, FIGS. 19-22.

At act 2522, a dielectric structure is formed over the CESL structure and a plurality of contacts is formed extending from the dielectric structure to the doped regions. See, for example, FIGS. 23-24.

Accordingly, in some embodiments, the present disclosure relates to an integrated chip (IC), including a substrate, a floating gate electrode disposed over the substrate, a contact etch stop layer (CESL) structure disposed over the floating gate electrode, an insulating stack separating the floating gate electrode from the CESL structure, the insulating stack including a first resist protective layer disposed over the floating gate electrode, a second resist protective layer disposed over the first resist protective layer, and an insulating layer separating the first resist protective layer from the second resist protective layer.

In other embodiments, the present disclosure relates to a method for forming an integrated chip (IC), including forming a floating gate electrode and a select gate electrode over a substrate, forming an insulating stack over the floating gate electrode and the select gate electrode, the insulating stack including a first resist protective layer, a second resist protective layer disposed over the first resist protective layer, and an insulating layer separating the first resist protective layer from the second resist protective layer, removing a portion of the insulating stack to expose the select gate electrode, and forming a contact etch stop layer (CESL) structure over the insulating stack and the select gate electrode.

In yet other embodiments, the present disclosure relates to an integrated chip (IC), including a substrate, a floating gate electrode disposed over the substrate, a first resist protective layer having a first thickness disposed over the floating gate electrode, a contact etch stop layer (CESL) structure disposed over the floating gate electrode, wherein the CESL structure has a second thickness that is less than the first thickness, a second resist protective layer having the first thickness disposed between the CESL structure and the first resist protective layer, and an insulating layer separating the first resist protective layer from the second resist protective layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip (IC), comprising:
    forming a floating gate electrode and a select gate electrode over a substrate;
        forming an insulating stack over the floating gate electrode and the select gate electrode, the insulating stack comprising a first resist protective layer, a second resist protective layer disposed over the first resist protective layer, and an insulating layer separating the first resist protective layer from the second resist protective layer;
    removing a first portion of the insulating stack such that a bottommost surface of the second resist protective layer is above an upper surface of the floating gate electrode to expose the select gate electrode, while leaving a second portion of the insulating stack over the floating gate electrode; and
    forming a contact etch stop layer (CESL) structure over the second portion of the insulating stack and over the select gate electrode.

2. The method of claim 1, further comprising:
    forming a plurality of silicide layers over the substrate and the exposed select gate electrode prior to forming the CESL structure.

3. The method of claim 1, further comprising:
    forming sidewall spacers along sidewalls of the floating gate electrode and the select gate electrode, wherein the sidewall spacers separate the first resist protective layer from the floating gate electrode after removing the first portion of the insulating stack.

4. The method of claim 1, wherein forming the insulating stack comprises:
    forming the first resist protective layer comprising a first material over the floating gate electrode and the select gate electrode;
    forming the insulating layer comprising a second material different than the first material over the first resist protective layer; and
    forming the second resist protective layer comprising the first material over the insulating layer.

5. The method of claim 1, wherein forming the floating gate electrode and the select gate electrode comprises:
    forming a gate dielectric structure over the substrate;
    forming a gate electrode structure over the gate dielectric structure; and
    patterning the gate electrode structure and the gate dielectric structure to respectively form the floating gate electrode overlying a floating gate dielectric layer and the select gate electrode overlying a select gate dielectric layer.

6. The method of claim 1, wherein removing a portion of the insulating stack comprises:
    performing a first etching process to remove a portion of the second resist protective layer that is laterally separated from the floating gate electrode, wherein the first etching process exposes a portion of the insulating layer;
    performing a second etching process to remove the exposed portion of the insulating layer; and performing a third etching process to remove a portion of the first resist protective layer that is laterally separated from the floating gate electrode.

7. A method for forming an integrated chip (IC), comprising:
forming a floating gate electrode and a select gate electrode over a substrate;
forming an insulating stack over the floating gate electrode and the select gate electrode, the insulating stack comprising a first resist protective layer, a second resist protective layer disposed over the first resist protective layer, and an insulating layer separating the first resist protective layer from the second resist protective layer;
removing a first portion of the insulating stack to expose the select gate electrode, while leaving a second portion of the insulating stack over the floating gate electrode, wherein the second portion of the insulating stack includes a second portion of the insulating layer and a second portion of the second resist protective layer that are confined solely above an upper surface of the first resist protective layer in the second portion of the insulating stack; and
forming a first nitride layer over the second portion of the insulating stack and over the select gate electrode.

8. The method of claim 7, wherein the insulating layer is more nitrogen rich than the first nitride layer.

9. The method of claim 7, further comprising:
before forming the first nitride layer, forming a first oxide layer;
forming a second oxide layer over the first nitride layer; and
forming a second nitride layer over the second oxide layer.

10. The method of claim 9, wherein the insulating layer is more nitrogen rich than the second nitride layer.

11. The method of claim 9, wherein the insulating layer has a refractive index that is less than a refractive index of the first nitride layer or the second nitride layer.

12. The method of claim 7, wherein the insulating layer has a thickness that is less than a thickness of the first resist protective layer.

13. The method of claim 12, wherein the thickness of the insulating layer is less than a thickness of the second resist protective layer.

14. The method of claim 7, wherein the insulating layer has a thickness that is equal to a thickness of the first nitride layer.

15. A method for forming an integrated chip (IC), comprising:
forming a floating gate electrode and a select gate electrode over a substrate, wherein the floating gate electrode is formed above a floating gate channel region, wherein the select gate electrode is formed above a select gate channel region, and wherein a doped region is laterally between the floating gate channel region and the select gate channel region;
forming an insulating stack over the floating gate electrode and the select gate electrode, the insulating stack comprising a first resist protective layer, a second resist protective layer disposed over the first resist protective layer, and an insulating layer separating the first resist protective layer from the second resist protective layer;
removing a portion of the insulating stack such that a bottommost surface of the second resist protective layer is above an upper surface of the floating gate electrode to expose the select gate electrode and to expose a portion of the doped region closest to the select gate channel region, wherein the insulating stack is directly over a portion of the doped region closest to the floating gate channel region; and
forming a first nitride layer over the insulating stack and the select gate electrode.

16. The method of claim 15, wherein an inner sidewall of the insulating stack is aligned with an outer sidewall of the doped region.

17. The method of claim 15, wherein a height of the first nitride layer directly over the floating gate electrode is larger than a height of the first nitride layer directly over the select gate electrode when measured from a top surface of the substrate.

18. The method of claim 15, wherein the first nitride layer has a maximum thickness laterally between the floating gate electrode and the select gate electrode measured perpendicular to a top surface of the substrate.

19. The method of claim 15, further comprising:
before forming the first nitride layer, forming a first oxide layer;
forming a second oxide layer over the first nitride layer; and
forming a second nitride layer over the second oxide layer, wherein a first combined thickness of the first nitride layer, the first oxide layer, the second oxide layer, and the second nitride layer is less than a second combined thickness of the insulating stack.

20. The method of claim 19, wherein the first combined thickness and the second combined thickness are both measured perpendicular to a top surface of the floating gate electrode when viewed from a cross section, and wherein the second combined thickness is larger than two times the first combined thickness.

* * * * *